US012593737B2

(12) United States Patent
Suk et al.

(10) Patent No.: US 12,593,737 B2
(45) Date of Patent: *Mar. 31, 2026

(54) SEMICONDUCTOR PACKAGE

(71) Applicant: SAMSUNG ELECTRONICS CO., LTD., Suwon-si (KR)

(72) Inventors: Kyoung Lim Suk, Suwon-si (KR); Taewon Yoo, Seoul (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 763 days.

This patent is subject to a terminal disclaimer.

(21) Appl. No.: 17/682,465

(22) Filed: Feb. 28, 2022

(65) Prior Publication Data

US 2023/0033087 A1 Feb. 2, 2023

(30) Foreign Application Priority Data

Jul. 30, 2021 (KR) ........................ 10-2021-0100753

(51) Int. Cl.
H01L 23/498 (2006.01)
H01L 21/48 (2006.01)
(Continued)

(52) U.S. Cl.
CPC .... H01L 23/49816 (2013.01); H01L 21/4857 (2013.01); H01L 21/486 (2013.01);
(Continued)

(58) Field of Classification Search
CPC ......... H01L 2224/023–0239; H01L 23/49816; H01L 21/4857; H01L 21/486;
(Continued)

(56) References Cited

U.S. PATENT DOCUMENTS 7,495,317 B2 2/2009 Song et al.
9,269,622 B2 2/2016 Scanlan et al.
(Continued)

FOREIGN PATENT DOCUMENTS

CN 112259511 A 1/2021
CN 112542449 A * 3/2021 ........... H10F 39/804
(Continued)

*Primary Examiner* — Monica D Harrison
*Assistant Examiner* — Moataz Khalifa
(74) *Attorney, Agent, or Firm* — Sughrue Mion, PLLC

(57) ABSTRACT

A semiconductor package is provided. The semiconductor package includes a first substrate including a first, second and third under-bump patterns; a semiconductor chip provided on the first substrate; conductive structures provided on the first substrate; and a second substrate provided on the semiconductor chip and the conductive structures. The third under-bump pattern is electrically isolated from the first and second under-bump patterns. The conductive structures include: a first conductive structure coupled to the first under-bump pattern; a second conductive structure coupled to the second under-bump pattern; and a third conductive structure coupled to the third under-bump pattern and provided adjacent to the first and second conductive structures. The third conductive structure is provided between the first conductive structure and the second conductive structure, the first under-bump pattern is wider than the third under-bump pattern, and the second under-bump pattern is wider than the third under-bump pattern.

20 Claims, 36 Drawing Sheets

(51) Int. Cl.

| | |
|---|---|
| *H01L 23/00* | (2006.01) |
| *H01L 23/50* | (2006.01) |
| *H01L 23/522* | (2006.01) |
| *H01L 23/528* | (2006.01) |
| *H01L 23/538* | (2006.01) |
| *H01L 25/065* | (2023.01) |
| *H01L 25/10* | (2006.01) |

(52) U.S. Cl.
CPC .. *H01L 23/49822* (2013.01); *H01L 23/49838* (2013.01); *H01L 23/5383* (2013.01); *H01L 23/5386* (2013.01); *H01L 24/16* (2013.01); *H01L 25/105* (2013.01); *H01L 2224/16227* (2013.01); *H01L 2224/16237* (2013.01); *H01L 2224/16238* (2013.01); *H01L 2225/1023* (2013.01); *H01L 2225/1041* (2013.01); *H01L 2225/1058* (2013.01); *H01L 2225/1094* (2013.01); *H01L 2924/1431* (2013.01); *H01L 2924/1434* (2013.01)

(58) Field of Classification Search
CPC ......... H01L 23/49822; H01L 23/49838; H01L 23/5383; H01L 23/5386; H01L 24/16; H01L 2224/16227; H01L 2224/16237; H01L 2224/16238; H01L 2225/1058; H01L 2225/06548; H01L 23/5226
See application file for complete search history.

(56) References Cited

U.S. PATENT DOCUMENTS

| | | | | |
|---|---|---|---|---|
| 9,318,442 | B1 | 4/2016 | Chen | |
| 10,096,553 | B2 | 10/2018 | Su et al. | |
| 10,157,823 | B2 | 12/2018 | Kim et al. | |
| 10,332,843 | B2 | 6/2019 | Baek et al. | |
| 10,354,961 | B2 | 7/2019 | Yu et al. | |
| 10,461,034 | B2 | 10/2019 | Wu et al. | |
| 10,872,865 | B2 * | 12/2020 | Yu | H01L 21/32051 |
| 11,037,878 | B1 * | 6/2021 | Yeh | H01L 23/481 |
| 11,348,864 | B2 | 5/2022 | Lee et al. | |
| 11,538,783 | B2 * | 12/2022 | Jin | H01L 24/14 |
| 2020/0006248 | A1 | 1/2020 | Yu et al. | |
| 2020/0365517 | A1 * | 11/2020 | Lin | H01L 24/14 |
| 2020/0402915 | A1 | 12/2020 | Kim et al. | |
| 2021/0098391 | A1 * | 4/2021 | Wu | H01L 23/552 |
| 2021/0118759 | A1 * | 4/2021 | Yu | H01L 24/73 |

FOREIGN PATENT DOCUMENTS

| | | | |
|---|---|---|---|
| KR | 10 2021 0046429 | A | 4/2021 |
| KR | 10 2021 0047243 | A | 4/2021 |

* cited by examiner

SEMICONDUCTOR PACKAGE

CROSS-REFERENCE TO RELATED APPLICATION

This application claims priority to Korean Patent Application 10-2021-0100753, filed on Jul. 30, 2021, in the Korean Intellectual Property Office, the entire contents of which are hereby incorporated by reference.

BACKGROUND

Methods, apparatuses and systems consistent with example embodiments relate to a semiconductor package, and in particular, a semiconductor package including a redistribution substrate and a method of fabricating the same.

A semiconductor package is configured to use a semiconductor chip as a part of an electronic product. The semiconductor package may include a printed circuit board (PCB) and a semiconductor chip, which is mounted on the PCB and is electrically connected to the PCB using bonding wires or bumps. With development of the electronic industry, many studies are being conducted to improve reliability and electric characteristics of the semiconductor package.

SUMMARY

Example embodiments provide a semiconductor package with improved reliability and electric characteristics, and a method of fabricating the same.

According to an example embodiment, a semiconductor package includes: a first substrate including a first under-bump pattern, a second under-bump pattern, and a third under-bump pattern; a semiconductor chip provided on the first substrate; conductive structures provided on the first substrate, laterally spaced apart from the semiconductor chip, and laterally spaced apart from each other; and a second substrate provided on the semiconductor chip and the conductive structures. The third under-bump pattern is electrically isolated from the first and second under-bump patterns. The conductive structures include: a first conductive structure coupled to the first under-bump pattern; a second conductive structure coupled to the second under-bump pattern; and a third conductive structure coupled to the third under-bump pattern and provided adjacent to the first and second conductive structures. The third conductive structure is provided between the first conductive structure and the second conductive structure. The first under-bump pattern is wider than the third under-bump pattern. The second under-bump pattern is wider than the third under-bump pattern.

According to an example embodiment, a semiconductor package includes: a first substrate; a semiconductor chip provided on the first substrate; conductive structures provided on the first substrate and laterally spaced apart from the semiconductor chip; and a second substrate provided on the semiconductor chip and the conductive structures. The conductive structures include a first conductive structure, a second conductive structure, and a third conductive structure, which are adjacent to each other. The third conductive structure is provided between, and electrically isolated from, the first and second conductive structures. The second substrate includes: a first redistribution pattern electrically connected to the first conductive structure; a second redistribution pattern electrically connected to the second conductive structure; and a third redistribution pattern electrically connected to the third conductive structure. An area of a top surface of the first redistribution pattern is larger than an area of a top surface of the third redistribution pattern, and an area of a top surface of the second redistribution pattern is larger than the area of the top surface of the third redistribution pattern.

According to an example embodiment, a semiconductor package includes: a first substrate including a first insulating layer, under-bump patterns, under-bump seed patterns, a first ground/power conductive pattern, a second ground/power conductive pattern, and a signal conductive pattern; a semiconductor chip provided on a top surface of the first substrate; conductive structures provided on the top surface of the first substrate, and laterally spaced apart from both the semiconductor chip and from each other; a mold layer provided on the top surface of the first substrate, side surfaces of the semiconductor chip and side surfaces of the conductive structures; and a second substrate provided on the mold layer and the conductive structures, and electrically connected to the conductive structures. The conductive structures include: a first conductive structure coupled to the first ground/power conductive pattern; a second conductive structure coupled to the second ground/power conductive pattern; a third conductive structure coupled to the signal conductive pattern; and a fourth conductive structure coupled to the first ground/power conductive pattern. The third conductive structure is provided between the first and second conductive structures. The under-bump seed patterns are provided on side surfaces of the under-bump patterns and are spaced apart from bottom surfaces of the under-bump patterns.

BRIEF DESCRIPTION OF THE DRAWINGS

The above and other aspects, features, and advantages will be more clearly understood from the following description, taken in conjunction with the accompanying drawings, in which:

FIGS. 5A and 5B are sectional views illustrating a semiconductor package according to an example embodiment.

FIG. 7B is a sectional view taken along a line A'-B' of FIG. 7A.

FIGS. 9A, 9B, 9C, 9D, 9E, 9F, 9G, 9H, 9I, 9J, 9K and 9L are sectional views illustrating a method of fabricating a semiconductor package according to an example embodiment.

FIGS. 10A, 10B and 10C are sectional views illustrating a method of fabricating a semiconductor package according to an example embodiment.

DETAILED DESCRIPTION

Figure 1A:
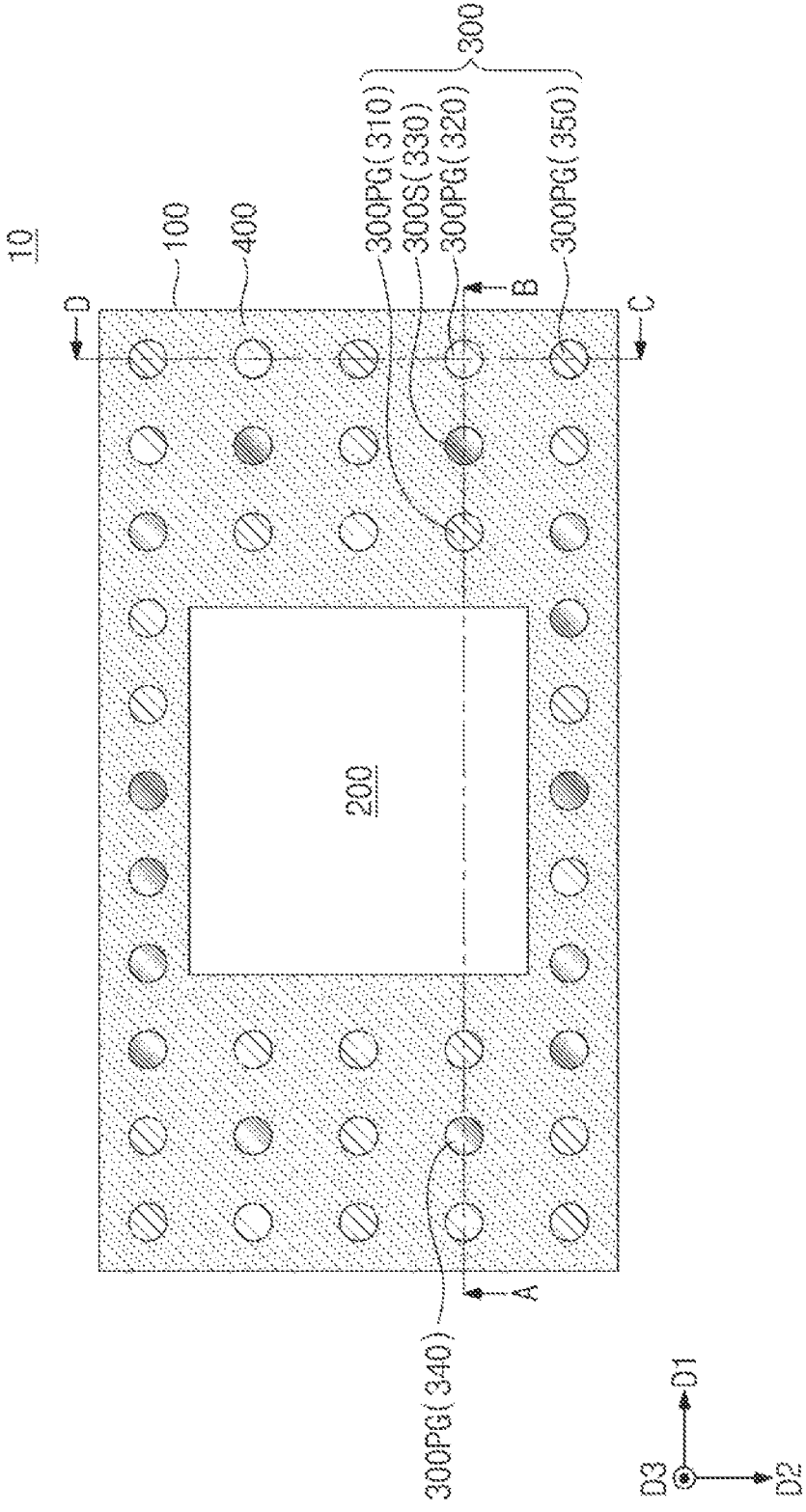
FIG. 1A is a plan view illustrating a semiconductor package according to an example embodiment.

Example embodiments will now be described more fully with reference to the accompanying drawings, in which example embodiments are shown. Like reference numerals refer to like elements throughout the specification. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1B:
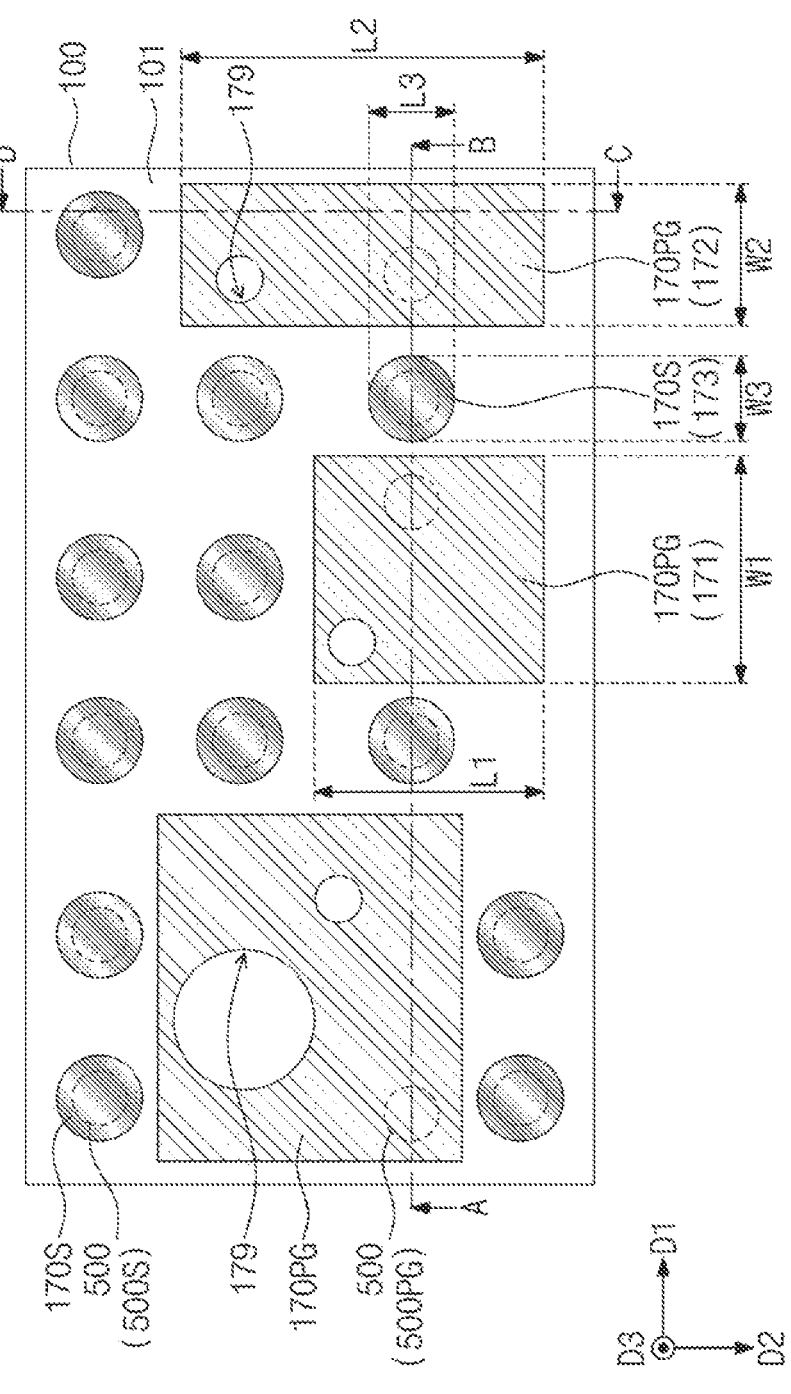
FIG. 1B is a plan view illustrating a first redistribution substrate according to an example embodiment.
Figure 1C:
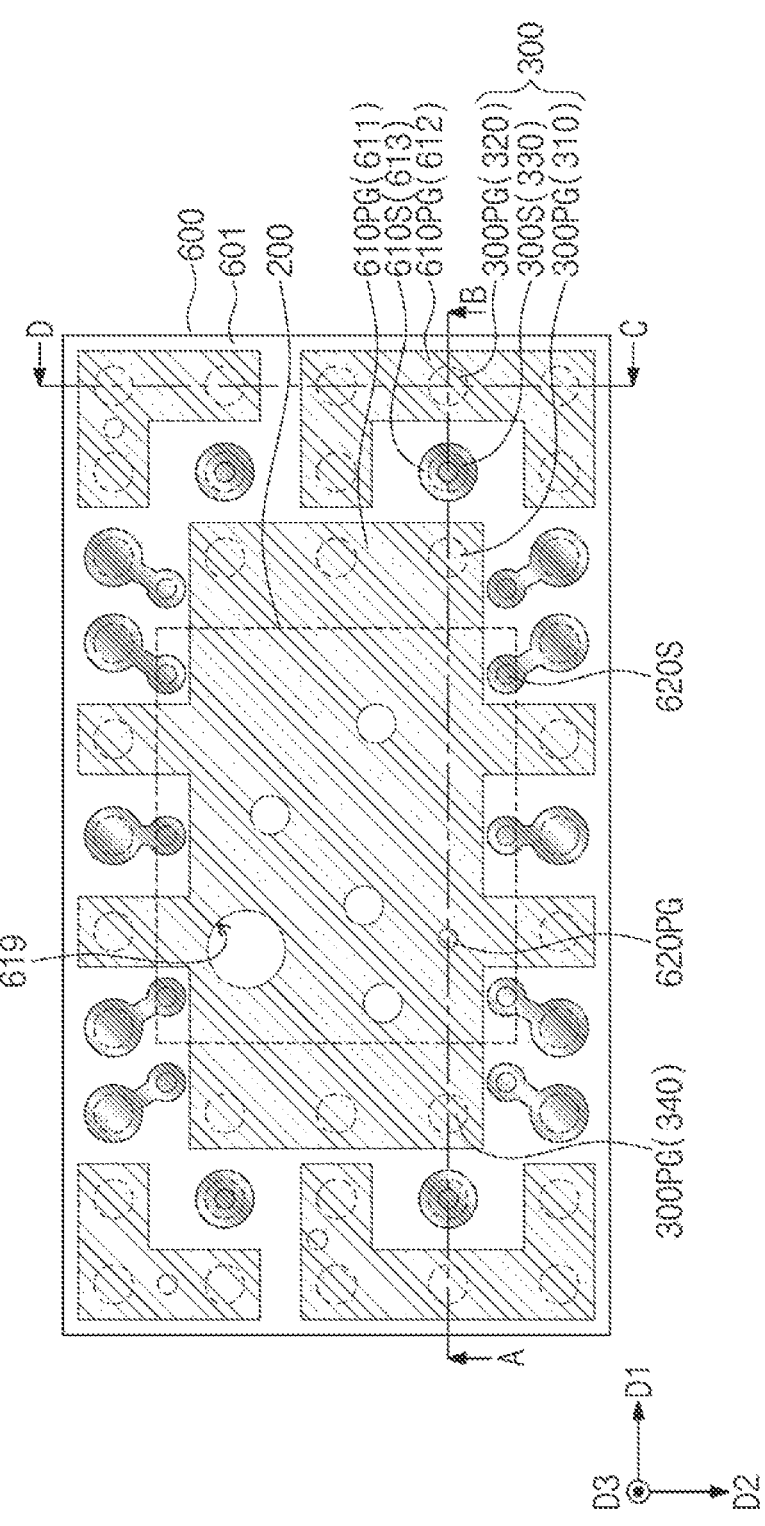
FIG. 1C is a plan view illustrating an arrangement structure of lower ground/power redistribution patterns, lower signal redistribution patterns, and conductive structures, according to an example embodiment.
Figure 1D:
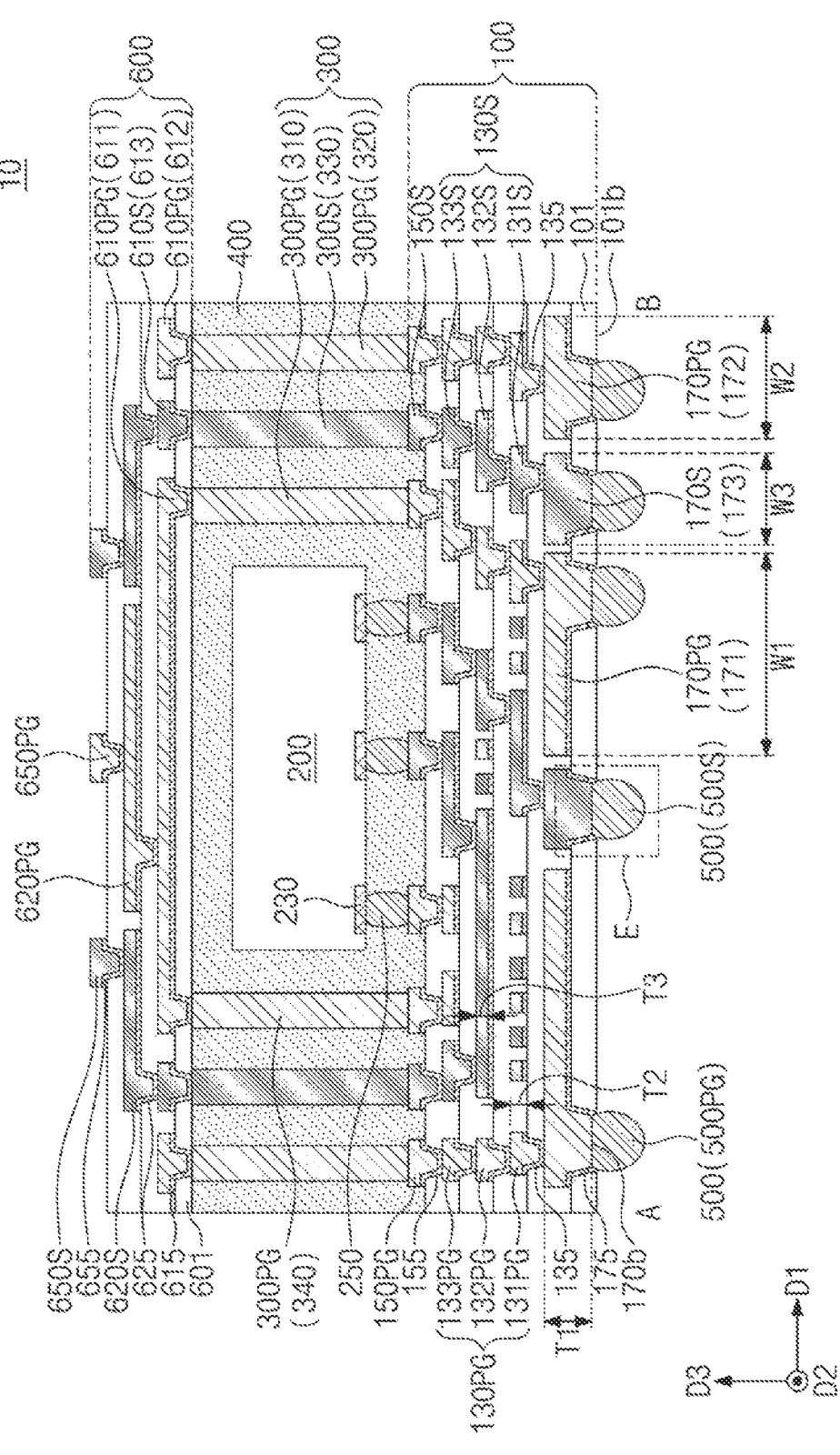
FIG. 1D is a sectional view taken along a line A-B of FIG. 1A.
Figure 1E:
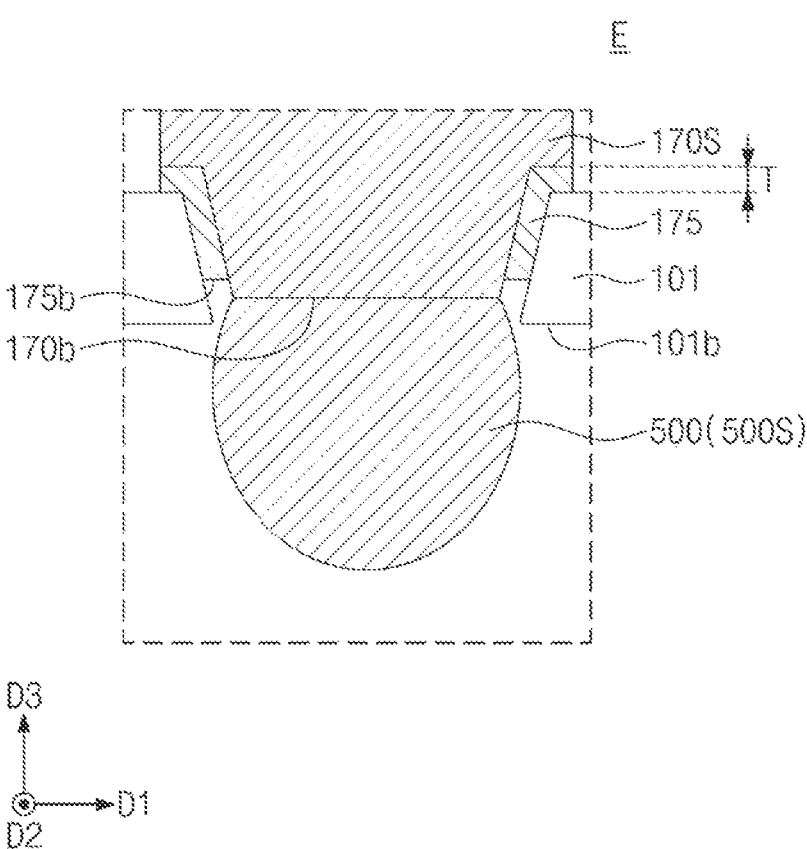
FIG. 1E is an enlarged sectional view illustrating a portion E of FIG. 1D.
Figure 1F:
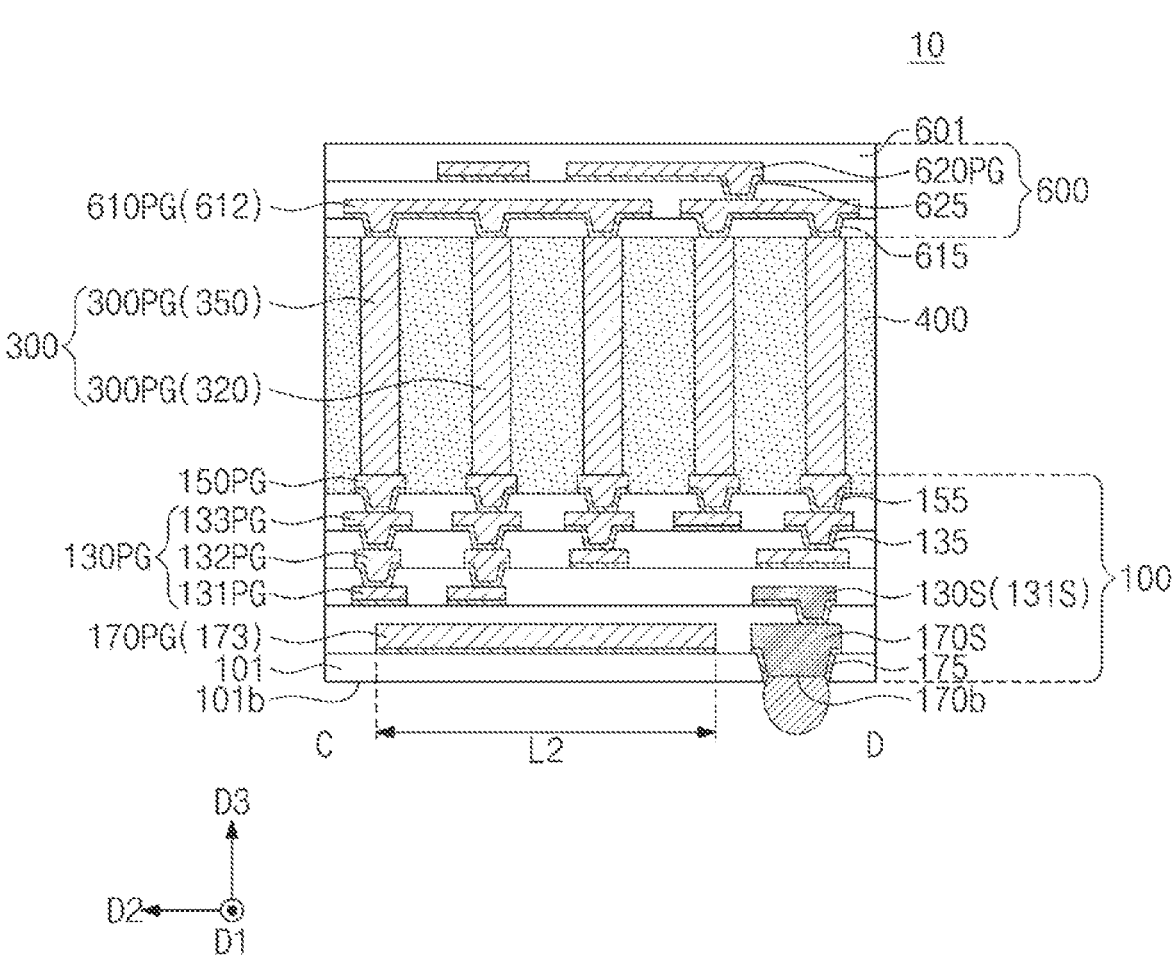
FIG. 1F is a sectional view taken along a line C-D of FIG. 1A.

FIG. 1A is a plan view illustrating a semiconductor package according to an example embodiment. FIG. 1B is a plan view illustrating a first redistribution substrate according to an example embodiment. FIG. 1C is a plan view illustrating an arrangement structure of lower ground/power redistribution patterns, lower signal redistribution patterns, and conductive structures, according to an example embodiment. FIG. 1D is a sectional view, which is taken along a line A-B of FIG. 1A and corresponds to sections taken along lines A-B of FIGS. 1B and 1C. FIG. 1E is an enlarged sectional view illustrating a portion E of FIG. 1D. FIG. 1F is a sectional view, which is taken along a line C-D of FIG. 1A and corresponds to sections taken along lines C-D of FIGS. 1B and 1C.

Referring to FIGS. 1A, 1B, 1C, 1D, and 1E, a semiconductor package 10 may include a first redistribution substrate 100, solder balls 500, a semiconductor chip 200, conductive structures 300, a mold layer 400, and a second redistribution substrate 600.

The solder balls 500 may be disposed on a bottom surface of a redistribution substrate. The solder balls 500 may be used as terminals of the semiconductor package 10. The solder balls 500 may include ground/power solder balls 500PG and signal solder balls 500S. The ground/power solder balls 500PG and the signal solder balls 500S may be laterally spaced apart from each other and may be electrically disconnected (i.e., electrically isolated) from each other. A ground voltage or a power voltage may be applied to one or more of the ground/power solder balls 500PG. A voltage applied to one of the ground/power solder balls 500PG may be different from a voltage applied to another of the ground/power solder balls 500PG. The signal solder balls 500S may be used as signal paths for inputting or outputting data signals to or from the semiconductor chip 200. The solder balls 500 may be formed of or include a solder material. The solder material may include tin, bismuth, lead, silver, or alloys thereof The first redistribution substrate 100 may include a first insulating layer 101, under-bump patterns 170PG and 170S, an under-bump seed pattern 175, ground/power conductive patterns 130PG, signal conductive patterns 130S, first seed patterns 135, seed pads 155, and first redistribution pads 150PG and 150S. The first insulating layer 101 may be formed of or include an organic material (e.g., a photosensitive insulating material). The photosensitive insulating material may include a polymeric material. For example, the photosensitive insulating material may be formed of or include at least one of photosensitive polyimide, polybenzoxazole, phenol-based polymers, or benzocyclobutene-based polymers. In an example embodiment, a plurality of the first insulating layers 101 may be provided. The number of the stacked first insulating layers 101 may be variously changed. In an example embodiment, the first insulating layers 101 may be formed of or include the same material. There may be no observable interface between adjacent ones of the first insulating layers 101.

A first direction D1 may be parallel to a bottom surface 101b of the lowermost one of the first insulating layers 101. A second direction D2 may be parallel to the bottom surface 101b of the lowermost one of the first insulating layers 101 and may be substantially perpendicular to the first direction D1. A third direction D3 may be substantially perpendicular to the first direction D1 and the second direction D2.

The under-bump patterns 170PG and 170S may include ground/power under-bump patterns 170PG and signal under-bump patterns 170S. Each of the under-bump patterns 170PG and 170S may be disposed in the lowermost one of the first insulating layers 101 and on the lowermost one of the first insulating layers 101. A lower portion of each of the under-bump patterns 170PG and 170S may be provided in the lowermost one of the first insulating layers 101. The lower portion of each of the under-bump patterns 170PG and 170S may serve as a solder pad. For example, the ground/power solder balls 500PG may be provided on bottom surfaces of the ground/power under-bump patterns 170PG and may be coupled to the ground/power under-bump patterns 170PG. The signal solder balls 500S may be provided on bottom surfaces of the signal under-bump patterns 170S and may be coupled to the signal under-bump patterns 170S. An upper portion of each of the under-bump patterns 170PG and 170S may have a width, which is larger than the lower portion, and may extend to a region on a top surface of the lowermost one of the first insulating layers 101.

As shown in FIG. 1D, a width of each of the ground/power under-bump patterns 170PG may be larger than a width of each of the signal under-bump patterns 170S. For example, a width of a top surface of each of the ground/power under-bump patterns 170PG may be larger than a width of a top surface of each of the signal under-bump patterns 170S. In an example embodiment, the under-bump patterns 170PG and 170S may include a first under-bump pattern 171 and a second under-bump pattern 172, which are laterally spaced apart from each other. The signal under-bump patterns 170S may include a third under-bump pattern 173. A width W1 of a top surface of the first under-bump pattern 171 and a width W2 of a top surface of the second under-bump pattern 172 may be greater than a width W3 of a top surface of the third under-bump pattern 173. A width of an element may be measured in the first direction D1.

As shown in FIG. 1B, a length of each of the ground/ power under-bump patterns 170PG may be larger than a length of each of the signal under-bump patterns 170S. For example, a length of the top surface of each of the ground/ power under-bump patterns 170PG may be larger than a length of the top surface of each of the signal under-bump patterns 170S. In an example embodiment, a length L1 of the top surface of the first under-bump pattern 171 and a length L2 of the top surface of the second under-bump pattern 172 may be larger than a length L3 of the top surface of the third under-bump pattern 173. A length of an element may be measured in the second direction D2.

When viewed in a plan view, an area of the top surface of each of the ground/power under-bump patterns 170PG may be larger than an area of the top surface of each of the signal under-bump patterns 170S. For example, an area of the top surface of the third under-bump pattern 173 may be smaller than an area of the top surface of the first under-bump pattern 171 and an area of the top surface of the second under-bump pattern 172.

Because the upper portion of the ground/power under-bump patterns 170PG has a relatively large width and length, the upper portion of each of the ground/power under-bump patterns 170PG may be used to deliver a voltage, which is transmitted from a solder terminal connected thereto, in a horizontal direction. The voltage may be a ground voltage or a power voltage. The term "horizontal" may be used to represent a direction parallel to the first or second direction D1 or D2.

Because the top surfaces of the ground/power under-bump patterns 170PG have a relatively large width and length, the ground/power under-bump patterns 170PG may act to shield electrical signals, which are generated from the signal conductive patterns 130S or an external device. Due to the shielding provided by the ground/power under-bump patterns 170PG, it may be possible to prevent or reduce an electrical interference issue from occurring between the signal conductive patterns 130S and the external device. It may be possible to improve reliability in operating the semiconductor package 10.

Hereinafter, the planar arrangement and shape of the under-bump patterns 170PG and 170S will be described in more detail. As shown in FIG. 1B, the planar shape of each of the signal under-bump patterns 170S may be circular. The signal under-bump patterns 170S may have the same planar area, but example embodiments are not limited thereto. If elements are described to have the same level, width, length, or area, the elements may be formed to have levels, widths, lengths, or areas within a specific process tolerance. In the present specification, a planar area of an element may indicate an area of a top surface of the element, unless the context clearly indicates otherwise. A planar shape of an element may indicate a planar shape of a top surface of the element. The top surfaces of the ground/power under-bump patterns 170PG may differ from the top surfaces of the signal under-bump patterns 170S in their shape and area. At least two of the ground/power under-bump patterns 170PG may have different shapes. At least two of the ground/power under-bump patterns 170PG may have different areas.

In the case where one of the ground/power under-bump patterns 170PG has a relatively large planar area, the one of the ground/power under-bump patterns 170PG may further have a first hole 179. The first hole 179 may be provided to penetrate the ground/power under-bump pattern 170PG from top and bottom. The first insulating layers 101, which are adjacent to the ground/power under-bump patterns 170PG, may be in direct contact with each other through the first hole 179. Even when the ground/power under-bump pattern 170PG has a large planar area, because the first hole 179 is provided, it may be possible to prevent the ground/ power under-bump patterns 170PG from being densely disposed in a specific region, when viewed in a plan view. Accordingly, it may be possible to improve reliability of the first redistribution substrate 100. The presence or absence and the number of the first hole 179 may be determined based on the planar area of the ground/power under-bump patterns 170PG. As an example, one of the ground/power under-bump patterns 170PG may not have the first hole 179. As another example, another of the ground/power under-bump patterns 170PG may have a plurality of first holes 179. At least two of the first holes 179 may be provided to have different shapes. At least two of the first holes 179 may have different diameters. The size and shape of the first holes 179 may be variously changed. Each of the signal under-bump patterns 170S may not have any hole penetrating the same.

The under-bump patterns 170PG and 170S may be formed of or include a metallic material (e.g., copper). In an example embodiment, the under-bump patterns 170PG and 170S may not include titanium.

Referring to FIGS. 1D and 1E, bottom surfaces 170b of the under-bump patterns 170PG and 170S may be placed at a level higher than the bottom surface 101b of the first insulating layer 101. The level may indicate a vertical level, and a difference in level between elements may be measured in the third direction D3.

The under-bump seed patterns 175 may be interposed between the lowermost one of the first insulating layers 101 and the under-bump patterns 170PG and 170S. For example, the under-bump seed patterns 175 may be provided on side surfaces of the lower portions of the under-bump patterns 170PG and 170S and bottom surfaces of the upper portions of the under-bump patterns 170PG and 170S. The under-bump seed patterns 175 may be formed of or include at least one of various conductive seed materials. The conductive seed material may be formed of or include at least one of copper, titanium, and/or alloys thereof The under-bump seed patterns 175 may serve as barrier layers and may prevent a material in the under-bump patterns 170PG and 170S from being diffused into other elements. The under-bump seed patterns 175 may be used as an adhesive layer. For example, an adhesive strength between the lowermost one of the first insulating layers 101 and the under-bump patterns 170PG and 170S may be improved by the under-bump seed patterns 175. Accordingly, it may be possible to prevent the under-bump patterns 170PG and 170S from being damaged. In addition, it may be possible to improve reliability and durability of the semiconductor package 10.

A bonding strength between the solder balls 500 and the conductive seed material may be relatively low. The under-bump seed patterns 175 may not be disposed on the bottom surfaces 170b of the under-bump patterns 170PG and 170S. The solder balls 500 may be in direct and physical contact with the bottom surfaces 170b of the under-bump patterns 170PG and 170S. An adhesive strength between the solder balls 500 and the under-bump patterns 170PG and 170S may be greater than a bonding strength between the solder balls 500 and conductive seed material. Accordingly, the solder balls 500 may be stably attached to the under-bump patterns 170PG and 170S.

As shown in FIG. 1E, each of the under-bump seed patterns 175 may have a first thickness T. The first thickness T may be a thickness of a first portion of each of the under-bump patterns 170PG and 170S, and a bottom surface of the first portion may be parallel to the first direction Dl. A bottommost surface 175*b* of each of the under-bump seed patterns 175 may be placed at a level, which is equal to or higher than the bottom surface 170*b* of the corresponding under-bump pattern 170PG or 170S. As an example, a difference in level between the bottommost surface 175*b* of the under-bump seed pattern 175 and the bottom surface 170*b* of the under-bump pattern 170PG or 170S may be larger than the first thickness T and may be smaller than 10 times the first thickness T. The bottom surface 170*b* of each of the under-bump patterns 170PG and 170S may be provided at a level higher than the bottom surface 101*b* of the lowermost one of the first insulating layers 101. A difference in level between the bottom surface 170*b* of each of the under-bump patterns 170PG and 170S and the bottom surface 101*b* of the lowermost one of the first insulating layers 101 may be substantially equal to the first thickness T.

Referring to FIGS. 1D and 1F, the conductive patterns 130PG and 130S may be provided on the under-bump patterns 170PG and 170S. The conductive patterns 130PG and 130S may include the ground/power conductive patterns 130PG and the signal conductive patterns 130S. The conductive patterns 130PG and 130S may be formed of or include a metallic material (e.g., copper). An expression "an element is coupled to the first redistribution substrate 100" may indicate that the element may be coupled to at least one of the conductive patterns 130PG and 130S.

The ground/power conductive patterns 130PG may be electrically connected to the ground/power under-bump patterns 170PG. Each of the ground/power conductive patterns 130PG may include a first ground/power conductive pattern 131PG, a second ground/power conductive pattern 132PG, and a third ground/power conductive pattern 133PG. The first ground/power conductive pattern 131PG may be provided on and coupled to a corresponding one of the ground/power under-bump patterns 170PG. The second ground/power conductive pattern 132PG may be provided between the first ground/power conductive pattern 131PG and the third ground/power conductive pattern 133PG and may be coupled to the first and third ground/power conductive patterns 131PG and 133PG. The number of the stacked ground/power conductive patterns 130PG is not limited to the illustrated example and may be variously changed.

Each of the signal conductive patterns 130S may include a first signal conductive pattern 131S, a second signal conductive pattern 132S, and a third signal conductive pattern 133S. The first signal conductive pattern 131S may be provided on and coupled to a corresponding one of the signal under-bump patterns 170S. The second signal conductive pattern 132S may be provided between the first signal conductive pattern 131S and the third signal conductive pattern 133S and may be coupled to the first and third signal conductive patterns 131S and 133S. The first signal conductive pattern 131S, the second signal conductive pattern 132S, and the third signal conductive pattern 133S may be laterally spaced apart from the first ground/power conductive pattern 131PG, the second ground/power conductive pattern 132PG, and the third ground/power conductive pattern 133PG, respectively. The expression "elements are laterally spaced apart from each other" may indicate that the elements are horizontally spaced apart from each other. Each of the first signal conductive pattern 131S, the second signal conductive pattern 132S, and the third signal conductive pattern 133S may be formed of or include the same material as a corresponding one of the first ground/power conductive pattern 131PG, the second ground/power conductive pattern 132PG, and the third ground/power conductive pattern 133PG.

Each of the ground/power conductive patterns 130PG and each of the signal conductive patterns 130S may include a via portion and a line portion. The via portion may be provided in a corresponding one of the first insulating layers 101. The line portion may be provided on the via portion, and may be directly connected to the via portion without an interface therebetween. A width of the line portion may be larger than a width of the via portion. The line portion may extend to a region on a top surface of the corresponding first insulating layer 101. In the present specification, the via portion may be an element for vertical interconnection, and the line portion may be an element for horizontal interconnection. The term "vertical" may be used to represent a direction normal to the bottom surface 101*b* of the lowermost one of the first insulating layers 101 (i.e., the third direction D3).

The first seed patterns 135 may be disposed on bottom surfaces of a corresponding one of the conductive patterns 130PG and 130S. For example, the first seed patterns 135 may be disposed on the bottom surfaces of the signal conductive patterns 130S and on the bottom surfaces of the ground/power conductive patterns 130PG. For example, each of the first seed patterns 135 may be provided on bottom and side surfaces of the via portion of a corresponding conductive pattern 130PG or 130S and a bottom surface of the line portion of the corresponding conductive pattern 130PG or 130S. The first seed patterns 135 may not extend onto a side surface of the line portion. The first seed patterns 135 may be formed of or include a material that is different from the under-bump patterns 170PG and 170S, the ground/power conductive patterns 130PG, and the signal conductive patterns 130S. For example, the first seed patterns 135 may be formed of or include a conductive seed material. The first seed patterns 135 may serve as barrier layers and may prevent diffusion of a material, which is included in the ground/power conductive patterns 130PG and the signal conductive patterns 130S.

Redistribution pads 150PG and 150S may be provided in the uppermost one of the first insulating layers 101. The redistribution pads 150PG and 150S may be further extended to a region on a top surface of the uppermost one of the first insulating layers 101. The redistribution pads 150PG and 150S may include ground/power redistribution pads 150PG and signal redistribution pads 150S. Each of the ground/power redistribution pads 150PG may be disposed on a corresponding one of the third ground/power conductive patterns 133PG. The ground/power redistribution pads 150PG may be coupled to the ground/power under-bump patterns 170PG through the ground/power conductive patterns 130PG. Each of the signal redistribution pads 150S may be disposed on a corresponding one of the third signal conductive patterns 133S. The signal redistribution pads 150S may be electrically connected to the signal under-bump patterns 170S through the signal conductive patterns 130S. The signal redistribution pads 150S may be electrically disconnected (i.e., electrically isolated) from the ground/power redistribution pads 150PG. Because the conductive patterns 130PG and 130S are provided, at least one of the redistribution pads 150PG and 150S may not be vertically aligned to the under-bump pattern 170PG or 170S electrically connected thereto. Accordingly, the disposition of the under-bump patterns 170PG and 170S or the redistribution pads 150PG and 150S may be more freely designed.

The redistribution pads 150PG and 150S may be formed of or include a metallic material (e.g., copper). Each of the redistribution pads 150PG and 150S may further include a protection pad. The protection pads may be provided on top surfaces of the redistribution pads 150PG and 150S and may be formed of or include at least one of nickel, gold, and/or alloys thereof.

The seed pads 155 may be provided on bottom surfaces of the redistribution pads 150PG and 150S, respectively. Each of the seed pads 155 may be interposed between the third signal conductive pattern 133S and a corresponding signal redistribution pad 150S or between the third ground/power conductive pattern 133PG and a corresponding ground/power redistribution pad 150PG. The seed pads 155 may extend into a region between the uppermost one of the first insulating layers 101 and the redistribution pads 150PG and 150S. The seed pads 155 may be formed of or include a material different from the first redistribution pads 150PG and 150S. The seed pads 155 may be formed of or include a conductive seed material.

In an example embodiment, as shown in FIG. 1D, the under-bump patterns 170PG and 170S may have a relatively large thicknesses T1. For example, the thicknesses T1 of the under-bump patterns 170PG and 170S may be larger than a thickness T2 of a line portion of each of the ground/power conductive patterns 130PG and a thickness T3 of a line portions of each of the signal conductive patterns 130S. Accordingly, the first redistribution substrate 100 may have improved reliability. In the case where the thicknesses T1 of the under-bump patterns 170PG and 170S are smaller than 5 μm, the reliability of the semiconductor package 10 may be deteriorated. In the case where the thicknesses T1 of the under-bump patterns 170PG and 170S are larger than 20 μm, it may be difficult to reduce a size of the semiconductor package 10. In an example embodiment, the thicknesses T1 of the under-bump patterns 170PG and 170S may range from about 5 μm to 20 μm. The semiconductor package 10 may have improved reliability and a reduced size.

In the case where an upper portion of each of the under-bump patterns 170PG and 170S has the same width as a lower portion thereof, the top surfaces of the first insulating layers 101 may have an undulating shape, due to the thicknesses T1 of the under-bump patterns 170PG and 170S. In this case, the undulating shape of the top surfaces of the first insulating layers 101 may lead to a failure in electric connection between the stacked first to third signal conductive patterns 131S, 132S, and 133S or between the first to third ground/power conductive patterns 131PG, 132PG, and 133PG. According to an example embodiment, the upper portion of each of the under-bump patterns 170PG and 170S may have a width larger than the lower portion thereof. Accordingly, it may be possible to prevent or suppress the top surfaces of the first insulating layers 101 from having undulating shape. Accordingly, a highly-reliable electric connection structure may be provided between the stacked first to third signal conductive patterns 131S, 132S, and 133S and between the stacked first to third ground/power conductive patterns 131PG, 132PG, and 133PG.

The semiconductor chip 200 may be mounted on a top surface of the first redistribution substrate 100. The semiconductor chip 200 may be disposed on a center region of the first redistribution substrate 100, when viewed in a plan view. The semiconductor chip 200 may be one of a logic chip, a buffer chip, and a memory chip. The logic chip may include an application specific integrated circuit (ASIC) chip or application processor (AP) chip. The ASIC chip may include an application specific integrated circuit. In another example embodiment, the semiconductor chip 200 may include a central processing unit (CPU) or a graphic processing unit (GPU).

The semiconductor chip 200 may include chip pads 230 and integrated circuits. The integrated circuits may be provided in the semiconductor chip 200. The chip pads 230 may be provided on a bottom surface of the semiconductor chip 200 and may be coupled to the integrated circuits in the semiconductor chip 200. An electric connection to the semiconductor chip 200 may indicate an electric connection to the integrated circuits through the chip pads 230 of the semiconductor chip 200.

Bumps 250 may be interposed between the first redistribution substrate 100 and the semiconductor chip 200. For example, the bumps 250 may be coupled to the redistribution pads 150PG and 150S and the chip pads 230. Accordingly, the semiconductor chip 200 may be coupled to the first redistribution substrate 100 through the bumps 250. Ground chip pads of the chip pads 230 may be coupled to at least one of the first to third ground/power conductive patterns 131PG, 132PG, and 133PG through the bumps 250. Power chip pads of the chip pads 230 may be coupled to at least one of the first to third ground/power conductive patterns 131PG, 132PG, and 133PG through the bumps 250. Signal chip pads of the chip pads 230 may be coupled to at least one of the first to third signal conductive patterns 131PG, 132PG, and 133PG through the bumps 250. The bumps 250 may be formed of or include at least one of solder materials. The bumps 250 may further include pillar patterns, and the pillar patterns may be formed of or include a metallic material (e.g., copper). In this case, the pillar patterns may be in contact with the chip pads 230.

The conductive structures 300 may be disposed on the top surface of the first redistribution substrate 100. The conductive structures 300 may be disposed on an edge region of the first redistribution substrate 100, when viewed in a plan view. The edge region of the first redistribution substrate 100 may be provided the center region and the side surfaces of the first redistribution substrate 100, when viewed in a plan view. The edge region of the first redistribution substrate 100 may be provided to enclose the center region, when viewed in a plan view. The conductive structures 300 may be laterally spaced apart from the semiconductor chip 200. The conductive structures 300 may be laterally spaced apart from each other. A width of the conductive structures 300 may be smaller than a width of the top surface of the redistribution pads 150PG and 150S.

The conductive structures 300 may include ground/power structures 300PG and signal structures 300S. The ground/power structures 300PG may be disposed on the ground/power redistribution pads 150PG. The ground/power structures 300PG may be electrically connected to the ground/power under-bump patterns 170PG through the ground/power conductive patterns 130PG. In the present specification, the expression "elements are electrically connected to each other" may indicate that the elements are directly connected to each other or are indirectly connected to each other through another element. The signal structures 300S may be disposed on the signal redistribution pads 150S. The signal structures 300S may be electrically connected to the signal under-bump patterns 170S or the semiconductor chip 200 through the signal conductive patterns 130S. A width of the signal structures 300S may be equal to or different from a width of the ground/power structures 300PG. The number of the signal structures 300S may be smaller than the number of the ground/power structures 300PG. Alternatively, the number of the signal structures 300S may be equal to or greater than the number of the ground/power structures 300PG.

The conductive structures 300 may be used as electrical conduction paths between the first redistribution substrate 100 and the second redistribution substrate 600. For example, the ground/power structures 300PG may be used to deliver the ground or power voltage. The signal structures 300S may be used to transmit data signals to an external device or the semiconductor chip 200.

The ground/power structures 300PG may include a first ground/power structure 310 and a second ground/power structure 320. The first ground/power structure 310 and the second ground/power structure 320 may be a first conductive structure and a second conductive structure, respectively. The ground/power structures 300PG may further include a fourth ground/power structure 340 and a fifth ground/power structure 350. The fourth ground/power structure 340 and the fifth ground/power structure 350 may be a fourth conductive structure and a fifth conductive structure, respectively. The fourth ground/power structure 340 and the fifth ground/power structure 350 will be described in more detail below.

The signal structures 300S may include a third conductive structure 330. The third conductive structure 330 may be used as a conduction path for fast transmission of the data signals. In the case where the others of the signal structures 300S are disposed near the third conductive structure 330, a coupling noise may occur between the others of the signal structures 300S and the third conductive structure 330. In an example embodiment, the third conductive structure 330 may be disposed between the first ground/power structure 310 and the second ground/power structure 320 in the first direction D1. Here, the third conductive structure 330 may be adjacent to the first ground/power structure 310 and the second ground/power structure 320. For example, any one of the conductive structures 300 may not be provided in a first region between the third conductive structure 330 and the first ground/power structure 310 and in a second region between the third conductive structure 330 and the second ground/power structure 320. The ground/power structures 300PG may prevent electric interference between the conductive elements 300. Because the third conductive structure 330 is disposed between the first and second ground/power structures 310 and 320, it may be possible to prevent a coupling noise issue from occurring in the third conductive structure 330. Accordingly, it may be possible to improve reliability and electric characteristics of the semiconductor package 10.

As shown in FIG. 1A, the third conductive structure 330 may be disposed between the ground/power structures 300PG in the second direction D2. Accordingly, the reliability and electric characteristics of the semiconductor package 10 may be further improved. The planar arrangement of the signal structures 300S and the ground/power structures 300PG is not limited to the illustrated example and may be variously changed.

As shown in FIG. 1D, the mold layer 400 may be disposed on the first redistribution substrate 100 and the semiconductor chip 200. The mold layer 400 may be provided on the uppermost one of the first insulating layers 101. The mold layer 400 may be provided on side surfaces of the conductive structures 300. A top surface of the mold layer 400 may be located at substantially the same level as top surfaces of the conductive structures 300. The mold layer 400 may further extend into a gap between the semiconductor chip 200 and the first redistribution substrate 100 to hermetically seal the bumps 250. The mold layer 400 may be formed of or include an insulating polymer (e.g., an epoxy molding compound). The mold layer 400 may not extend to a region below the bottom surface of the semiconductor chip 200, and an under-fill layer may be further provided in a gap region between the first redistribution substrate 100 and the semiconductor chip 200. The under-fill layer may be formed of or include an insulating polymer (e.g., an epoxy polymer).

The second redistribution substrate 600 may be disposed on the mold layer 400 and the conductive structures 300 and may be electrically connected to the conductive structures 300. For example, the second redistribution substrate 600 may be disposed on the semiconductor chip 200 and may be spaced apart from a top surface of the semiconductor chip 200. The mold layer 400 may extend into a region between the top surface of the semiconductor chip 200 and the second redistribution substrate 600.

The second redistribution substrate 600 may include a second insulating layer 601, redistribution patterns, second seed patterns 615, third seed patterns 625, the upper seed pads 655, and bonding pads 650PG and 650S. The second insulating layer 601 may include a plurality of second insulating layers 601. The second insulating layers 601 may be stacked on the mold layer 400. The second insulating layers 601 may be formed of or include at least one of photosensitive insulating materials or insulating polymers. In an example embodiment, the second insulating layers 601 may be formed of or include the same material. There may be no observable interface between adjacent ones of the second insulating layers 601, but example embodiments are not limited thereto. The number of the second insulating layers 601 may be variously changed.

The redistribution patterns may include lower redistribution patterns 610PG and 610S and upper redistribution patterns 620PG and 620S. The lower redistribution patterns 610PG and 610S may include lower ground/power redistribution patterns 610PG and lower signal redistribution patterns 610S. The lower redistribution patterns 610PG and 610S may be laterally spaced apart from each other and may be electrically disconnected (i.e., electrically isolated) from each other. Each of the lower redistribution patterns 610PG and 610S may include a first via portion and a first line portion. The first via portion of each of the lower redistribution patterns 610PG and 610S may be provided in the lowermost one of the second insulating layers 601 to be in contact with a top surface of a corresponding conductive structure 300. A width of the first via portion of each of the lower redistribution patterns 610PG and 610S may be smaller than a width of a corresponding conductive structure 300. The first line portion may be provided on the first via portion and may be connected to the first via portion without an interface therebetween. A width of the first line portion of each of the lower redistribution patterns 610PG and 610S may be larger than a width of a top surface of the first via portion. The first line portion may extend to a region on a top surface of the corresponding second insulating layer 601. At least one of the lower ground/power redistribution patterns 610PG may include a plurality of first via portions, and the first line portion may be connected to the first via portions. The lower redistribution patterns 610PG and 610S may be formed of or include a metallic material (e.g., copper).

The lower ground/power redistribution patterns 610PG may be disposed on the ground/power structures 300PG and may be electrically connected to the ground/power structures 300PG. The lower ground/power redistribution patterns 610PG may include a first ground/power redistribution pattern 611 and a second ground/power redistribution pattern 612. The first ground/power redistribution pattern 611 may be electrically connected to the first ground/power structure 310. The second ground/power redistribution pattern 612 may be electrically connected to the second ground/power structure 320. The second ground/power redistribution pattern 612 may be laterally spaced apart from and electrically disconnected (i.e., electrically isolated) from the first ground/power redistribution pattern 611, but example embodiments are not limited thereto.

The lower signal redistribution patterns 610S may be disposed on the signal structures 300S and may be electrically connected to the signal structures 300S. As an example, the lower signal redistribution patterns 610S may correspond to the signal structures 300S in a one-to-one manner. That is, each of the lower signal redistribution patterns 610S may be electrically connected to a corresponding one of the signal structures 300S, as shown in FIGS. 1C and 1D. The lower signal redistribution patterns 610S may include a third redistribution pattern 613. The third redistribution pattern 613 may be electrically connected to the third conductive structure 330. The third redistribution pattern 613 may not be electrically connected to the others of the conductive structures 300 excluding the third conductive structure 330. Hereinafter, the lower ground/power redistribution patterns 610PG and the lower signal redistribution patterns 610S will be described in more detail below.

As shown in FIG. 1C, a top surface of each of the lower ground/power redistribution patterns 610PG may have a planar area larger than a top surface of each of the lower signal redistribution patterns 610S. For example, a planar area of a top surface of the first ground/power redistribution pattern 611 may be larger than a planar area of a top surface of the third redistribution pattern 613. An area of a top surface of the second ground/power redistribution pattern 612 may be larger than the area of the top surface of the third redistribution pattern 613.

In the case where one of the lower ground/power redistribution patterns 610PG has a relatively large planar area, the one of the lower ground/power redistribution patterns 610PG may have a second hole 619. The second hole 619 may be formed to penetrate the lower ground/power redistribution pattern 610PG from top to bottom. For example, the planar area of the first ground/power redistribution pattern 611 may be relatively large. The first ground/power redistribution pattern 611 may have the second hole 619. Because the second holes 619 are provided, it may be possible to prevent the lower ground/power redistribution patterns 610PG from being densely disposed in a specific region, when viewed in a plan view. Accordingly, it may be possible to improve reliability of the second redistribution substrate 600. The second hole 619 may not be provided in the second ground/power redistribution pattern 612. Alternatively, the second hole 619 may be further provided in the second ground/power redistribution pattern 612. The presence or absence of the second holes 619 and the number of the second holes 619 may be determined based on the planar area of the lower ground/power redistribution patterns 610PG. The second insulating layers 601, which are adjacent to the lower ground/power redistribution patterns 610PG, may be in direct contact with each other through the second hole 619. Each of the lower signal redistribution patterns 610S may not have a hole penetrating the same.

As shown in FIGS. 1C, 1D, and 1E, at least one of the lower ground/power redistribution patterns 610PG may be overlapped with a plurality of the ground/power structures 300PG, when viewed in a plan view. The one of the lower ground/power redistribution patterns 610PG may be electrically connected to the ground/power structures 300PG. For example, the first ground/power redistribution pattern 611 may be provided on the fourth ground/power structure 340 and may be electrically connected to the fourth ground/power structure 340. The fourth ground/power structure 340 may be electrically connected to the first ground/power structure 310 through the first ground/power redistribution pattern 611. In other words, the first ground/power structure 310 and the fourth ground/power structure 340 may be coupled to each other by the first ground/power redistribution pattern 611 to form a single conductive element/structure. The first ground/power structure 310 and the fourth ground/power structure 340 may be applied with the same voltage.

As shown in FIGS. 1C and IF, the second ground/power redistribution pattern 612 may be further provided on the fifth ground/power structure 350 and may be electrically connected to the fifth ground/power structure 350. The fifth ground/power structure 350 may be electrically connected to the second ground/power structure 320 through the second ground/power redistribution pattern 612. The second ground/power structure 320 and the fifth ground/power structure 350 may be coupled to each other by the second ground/power redistribution pattern 612 to form a single conductive element/structure. The second ground/power structure 320 and the fifth ground/power structure 350 may be applied with the same voltage. The number of the ground/power structures 300PG, which are coupled to the first ground/power redistribution pattern 611, and the number of the ground/power structures 300PG, which are coupled to the second ground/power redistribution pattern 612, may be variously changed.

The second seed patterns 615 may be respectively disposed under bottom surfaces of the lower ground/power redistribution patterns 610PG and bottom surfaces of the lower signal redistribution patterns 610S. For example, the second seed patterns 615 may be in direct contact with the top surfaces of the conductive structures 300. The second seed patterns 615 may extend into regions between the lower redistribution patterns 610PG and 610S and the lowermost one of the second insulating layers 601. The second seed patterns 615 may be formed of or include a conductive seed material. The second seed patterns 615 may be used as barrier layers.

The upper redistribution patterns 620PG and 620S may include upper ground/power redistribution patterns 620PG and upper signal redistribution patterns 620S. Each of the upper redistribution patterns 620PG and 620S may include a second via portion and a second line portion. The second via portion of each of the upper redistribution patterns 620PG and 620S may be provided in the corresponding second insulating layer 601. The second line portion may be provided on and connected to the second via portion, and in this case, there may be no observable interface between the second line portion and the second via portion. A width of the second line portion may be larger than a width of a top surface of the second via portion. The second line portion may extend to a region on the top surface of the corresponding second insulating layer 601. The upper redistribution patterns 620PG and 620S may be formed of or include a metallic material (e.g., copper).

The upper signal redistribution patterns 620S may be disposed on the lower signal redistribution patterns 610S and may be electrically connected to the lower signal redistribution patterns 610S. The upper signal redistribution patterns 620S may be coupled to the signal structures 300S through the lower redistribution patterns 610S in a one-to-one manner.

The upper ground/power redistribution patterns 620PG may be disposed on the lower signal redistribution patterns 610S and may be electrically connected to the lower signal redistribution patterns 610S. At least one of the upper ground/power redistribution patterns 620PG may be electrically connected to a plurality of the ground/power structures 300PG. The upper ground/power redistribution patterns 620PG may be laterally spaced apart from the upper signal redistribution patterns 620S and may be electrically disconnected (i.e., electrically isolated) from the upper signal redistribution patterns 620S. A top surface of each of the upper ground/power redistribution patterns 620PG may have an area larger than a top surface of each of the upper signal redistribution patterns 620S. In this case, at least one of the upper ground/power redistribution patterns 620PG may further have holes. The holes may be provided to have features that are similar to the second holes 619 in the previous example embodiment described with reference to FIG. 1C. However, example embodiments are not limited to this example.

The first ground/power structure 310 and the fourth ground/power structure 340 may be coupled to each other through one of the upper ground/power redistribution patterns 620PG to form a single conductive element/structure. As another example, the second ground/power structure 320 and the fifth ground/power structure 350 may be coupled to each other through another of the upper ground/power redistribution patterns 620PG to form a single conductive element/structure.

An electric connection to the second redistribution substrate 600 may indicate an electric connection to at least one of the lower ground/power redistribution patterns 610PG, the lower signal redistribution patterns 610S, the upper ground/power redistribution patterns 620PG, and the upper signal redistribution patterns 620S.

The third seed patterns 625 may be disposed on bottom surfaces of the upper ground/power redistribution patterns 620PG and bottom surfaces of the upper signal redistribution patterns 620S. For example, the third seed patterns 625 may be interposed between the lower redistribution patterns 610PG and 610S and the upper redistribution patterns 620PG and 620S. For example, the second seed patterns 615 may be formed of or include a conductive seed material. The second seed patterns 615 may be used as barrier layers.

The bonding pads 650PG and 650S may include ground/power bonding pads 650PG and signal bonding pads 650S. The ground/power bonding pads 650PG may be provided on and coupled to the upper ground/power redistribution patterns 620PG. The signal bonding pads 650S may be provided on and coupled to the upper signal redistribution patterns 620S. The bonding pads 650PG and 650S may be laterally spaced apart from each other.

A lower portion of each of the bonding pads 650PG and 650S may be provided in the uppermost one of the second insulating layers 601. An upper portion of each of the bonding pads 650PG and 650S may be further extended to a region on a top surface of the uppermost one of the second insulating layers 601. The upper portion of each of the bonding pads 650PG and 650S may have a width larger than the lower portion. The bonding pads 650PG and 650S may be formed of or include a metallic material (e.g., copper). Because the upper redistribution patterns 620PG and 620S and the lower redistribution patterns 610PG and 610S are provided, at least one bonding pad 650PG or 650S may not be vertically aligned to the conductive structure 300 electrically connected thereto. Accordingly, the disposition of the bonding pads 650PG and 650S may be more freely designed.

The upper seed pads 655 may be provided on bottom surfaces of the bonding pads 650PG and 650S, respectively. The upper seed pads 655 may be interposed between the upper redistribution patterns 620PG and 620S and the bonding pads 650PG and 650S. The upper seed pads 655 may be formed of or include a conductive seed material.

Figure 2:
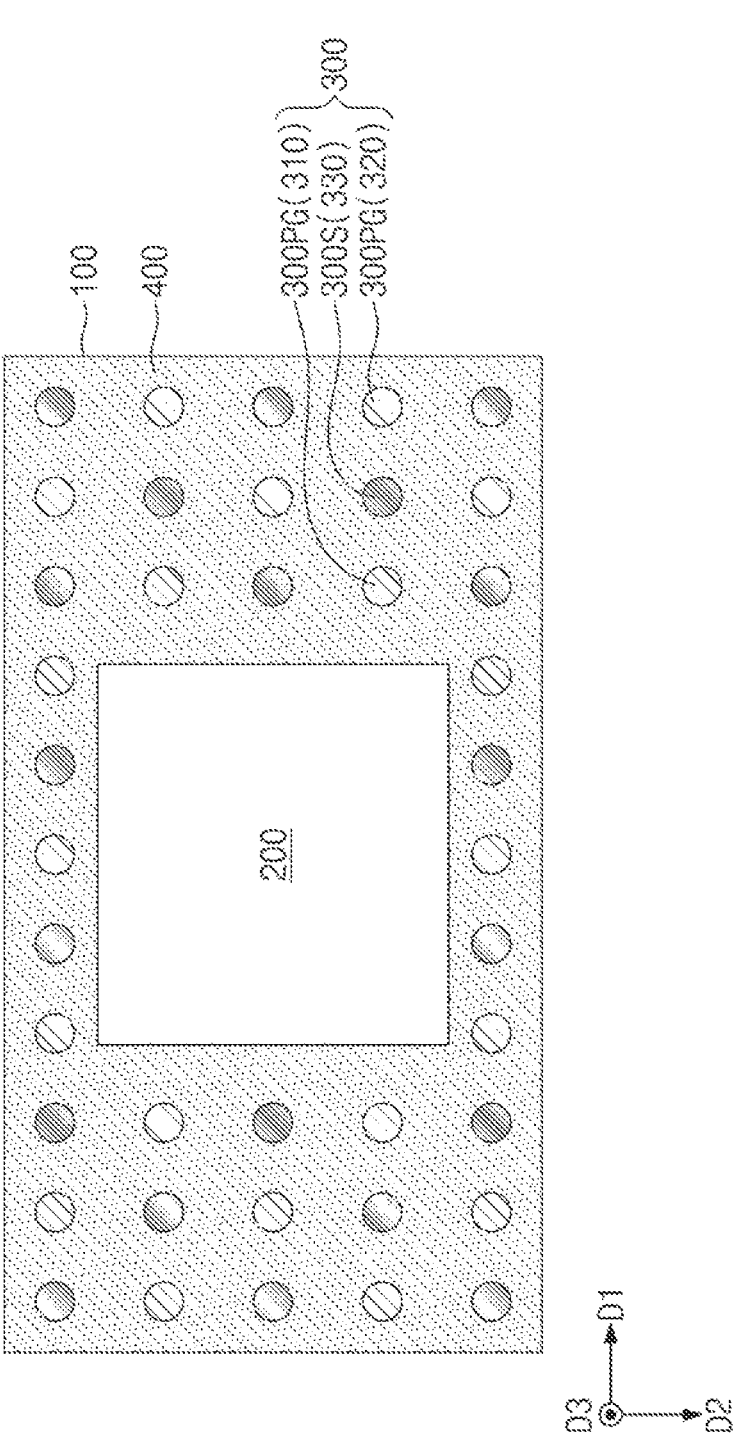
FIG. 2 is a plan view illustrating an arrangement structure of conductive structures according to an example embodiment.

FIG. 2 is a plan view illustrating an arrangement structure of conductive structures according to an example embodiment. For concise description, a previously described element may be identified by the same reference number without repeating an overlapping description thereof Referring to FIG. 2, the conductive structures 300 may include the ground/power structures 300PG and the signal structures 300S. The ground/power structures 300PG and the signal structures 300S may be alternately disposed, when viewed in a plan view. For example, the ground/power structures 300PG and the signal structures 300S may be alternately arranged in the first direction D1. The ground/power structures 300PG and the signal structures 300S may be alternately arranged in the second direction D2. The third conductive structure 330 of the signal structures 300S may be disposed between the first ground/power structure 310 and the second ground/power structure 320. The disposition of the conductive structures 300 may be variously changed.

Figure 3A:
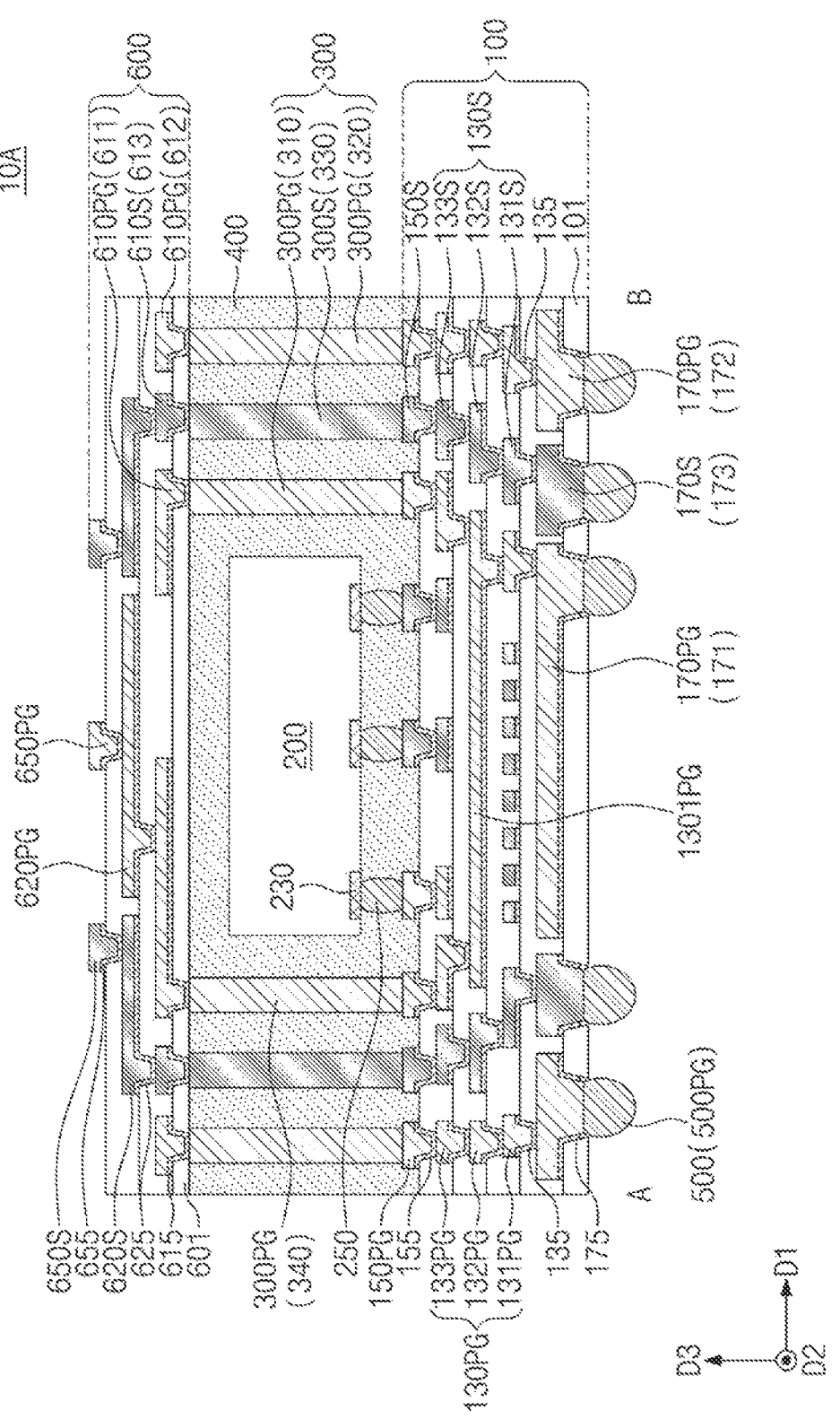
FIGS. 3A and 3B are sectional views illustrating a semiconductor package according to an example embodiment.
Figure 3B:
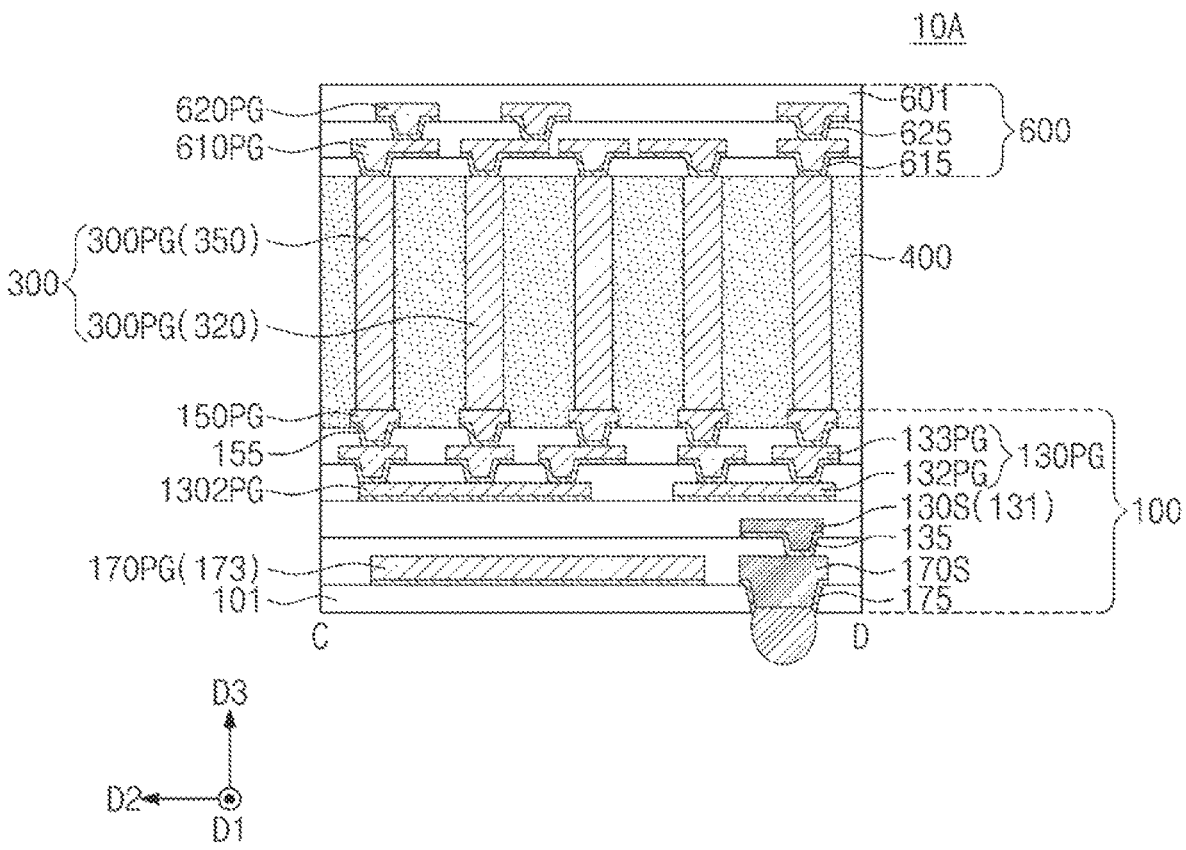

FIG. 3A is a sectional view, which is taken along the line A-B of FIG. 1A to illustrate a semiconductor package according to an example embodiment. FIG. 3B is a sectional view, which is taken along the line C-D of FIG. 1A to illustrate a semiconductor package according to an example embodiment. For concise description, a previously described element may be identified by the same reference number without repeating an overlapping description thereof.

Referring to FIGS. 1A, 3A, and 3B, the semiconductor package 10A may include the first redistribution substrate 100, the solder balls 500, the semiconductor chip 200, the conductive structures 300, the mold layer 400, and the second redistribution substrate 600. The conductive structures 300, the signal under-bump patterns 170S, and the ground/power under-bump patterns 170PG may be configured to have substantially the same features as those in the previous example embodiment described with reference to FIGS. 1A to 1F. For example, widths of the ground/power under-bump patterns 170PG may be larger than widths of the signal under-bump patterns 170S, and lengths of the ground/power under-bump patterns 170PG may be larger than lengths of the signal under-bump patterns 170S, respectively. Planar areas of the ground/power under-bump patterns 170PG may be larger than planar areas of the signal under-bump patterns 170S, respectively. The conductive structures 300 may include the ground/power structures 300PG and the signal structures 300S. However, the ground/power structures 300PG may not be coupled to each other by the lower ground/power redistribution patterns 610PG.

At least two of the ground/power structures 300PG may be coupled to each other by the ground/power conductive patterns 130PG of the first redistribution substrate 100. For example, the ground/power conductive patterns 130PG may include a first ground/power shared pattern 1301PG and a second ground/power shared pattern 1302PG. The first ground/power shared pattern 1301PG and the second ground/power shared pattern 1302PG may be referred to as a first shared conductive pattern and a second shared conductive pattern, respectively. The first ground/power shared pattern 1301PG may have a relatively large planar area. The first ground/power shared pattern 1301PG may be one of the second ground/power conductive patterns 132PG. The first ground/power structure 310 may be electrically connected to the first ground/power shared pattern 1301PG through the corresponding third ground/power conductive pattern 133PG. The fourth ground/power structure 340 may be electrically connected to the first ground/power shared pattern 1301PG through the corresponding third ground/power conductive pattern 133PG. Accordingly, the first ground/power structure 310 and the fourth ground/power structure 340 may be electrically connected to each other through the first ground/power shared pattern 1301PG. The first ground/power structure 310 and the fourth ground/power structure 340 may be applied with the same voltage through the first under-bump patterns 171. Because the first ground/power shared pattern 1301PG is provided, it may be possible to simplify electric conduction paths between the first under-bump patterns 171 and the first and fourth ground/power structures 310 and 340. That is, it may be possible to design the ground/power conductive patterns 130PG in a more simplified manner.

The second ground/power shared pattern 1302PG may be electrically connected to the second under-bump pattern 172. The second ground/power shared pattern 1302PG may be another of the second ground/power conductive patterns 132PG. The second ground/power shared pattern 1302PG may have a relatively large planar area. As shown in FIG. 3B, the second ground/power shared pattern 1302PG may be electrically connected to the second ground/power structure 320 and the fifth ground/power structure 350 through the third ground/power conductive patterns 133PG and the ground/power redistribution pads 150PG. Accordingly, the second ground/power structure 320 and the fifth ground/power structure 350 may be electrically connected to each other through the second ground/power shared pattern 1302PG. The second ground/power structure 320 and the fifth ground/power structure 350 may be applied with the same voltage. Because the second ground/power shared pattern 1302PG is provided, it may be possible to design the ground/power conductive patterns 130PG in a more simplified manner.

For example, the first ground/power shared pattern 1301PG may be one of the first ground/power conductive patterns 131PG or one of the third ground/power conductive patterns 133PG.

As another example, the second ground/power shared pattern 1302PG may be one of the first ground/power conductive patterns 131PG or one of the third ground/power conductive patterns 133PG.

At least one of the first ground/power shared pattern 1301PG and the second ground/power shared pattern 1302PG may further have a hole penetrating therethrough. The hole may be similar to the first holes 179 of the under-bump patterns 170PG and 170S of FIG. 1B.

Figure 4A:
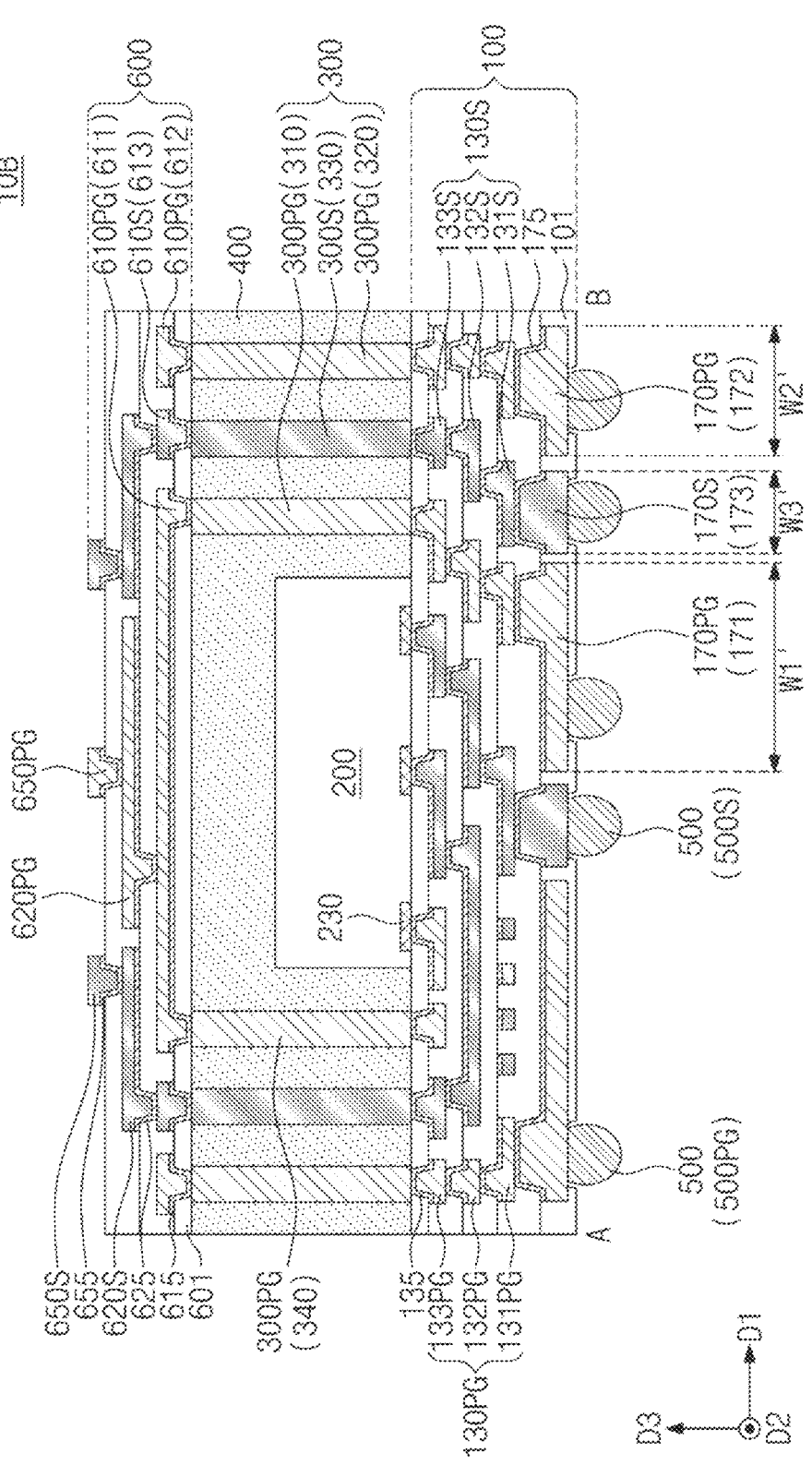
FIGS. 4A and 4B are sectional views illustrating a semiconductor package according to an example embodiment.
Figure 4B:
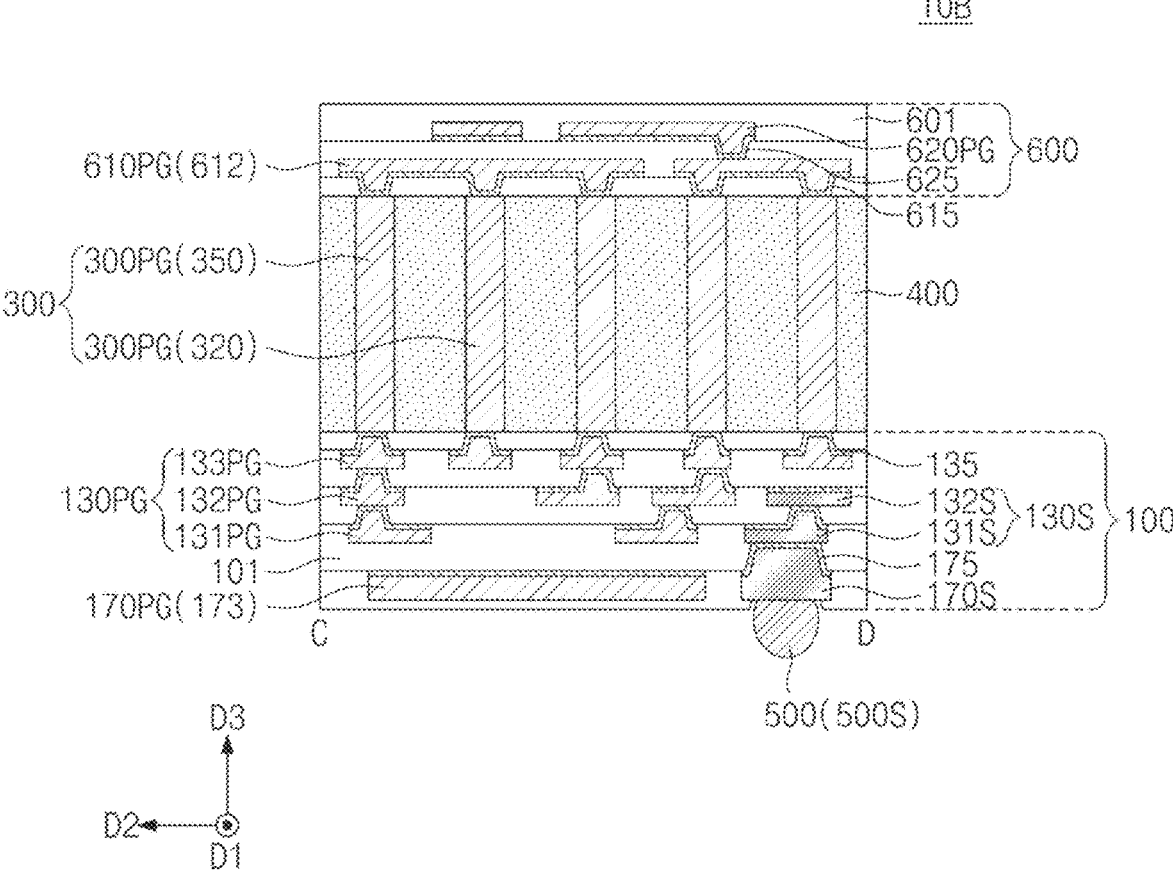

FIG. 4A is a sectional view, which is taken along the line A-B of FIG. 1A to illustrate a semiconductor package according to an example embodiment. FIG. 4B is a sectional view, which is taken along the line C-D of FIG. 1A to illustrate a semiconductor package according to an example embodiment.

Referring to FIGS. 1A, 4A, and 4B, the semiconductor package 10B may include the first redistribution substrate 100, the solder balls 500, the semiconductor chip 200, the conductive structures 300, the mold layer 400, and the second redistribution substrate 600. The semiconductor chip 200, the conductive structures 300, the mold layer 400, and the second redistribution substrate 600 may be configured to have substantially the same features discussed above. However, the semiconductor package 10B may not include the bumps 250 described with reference to FIG. 1D.

The first redistribution substrate 100 may include the under-bump patterns 170PG and 170S, the under-bump seed pattern 175, the first insulating layers 101, the ground/power conductive patterns 130PG, the signal conductive patterns 130S, and the first seed patterns 135. In the present example embodiment, the first redistribution substrate 100 may not include the redistribution pads 150PG and 150S and the seed pads 155 of FIG. 1D.

The first redistribution substrate 100 may be in direct contact with the semiconductor chip 200 and the mold layer 400. For example, the uppermost one of the first insulating layers 101 may be in direct and physical contact with the bottom surface of the semiconductor chip 200 and the bottom surface of the mold layer 400. The first seed patterns 135 in the uppermost one of the first insulating layers 101 may be directly coupled to the chip pads 230 and the conductive structures 300. The first seed patterns 135 may be provided on the top surfaces of the ground/power conductive patterns 130PG and the top surfaces of the signal conductive patterns 130S. A line portion of each of the ground/power conductive patterns 130PG and the signal conductive patterns 130S may be provided under a bottom surface of the via portion thereof.

The lower portion of each of the signal under-bump patterns 170S may have a width larger than the upper portion thereof The signal solder balls 500S may be disposed on bottom surfaces of the signal under-bump patterns 170S, respectively. The lower portion of each of the ground/power under-bump patterns 170PG may have a width larger than the upper portion thereof. The ground/power solder balls 500PG may be disposed on bottom surfaces of the ground/power under-bump patterns 170PG, respectively. A width of the bottom surfaces of the ground/power under-bump patterns 170PG may be larger than a width of the bottom surfaces of the signal under-bump patterns 170S. For example, a width W1' of a bottom surface of the first under-bump pattern 171 and a width W2' of the second under-bump pattern 172 may both be larger than a width W3' of a bottom surface of the third under-bump pattern 173. A length of the bottom surface of each of the ground/power under-bump patterns 170PG may be larger than a length of the bottom surface of each of the signal under-bump patterns 170S. An area of the bottom surface of each of the ground/power under-bump patterns 170PG may be larger than an area of the bottom surface of each of the signal under-bump patterns 170S.

The first ground/power redistribution pattern 611 may be electrically connected to the first ground/power structure 310 and the fourth ground/power structure 340. As shown in FIG. 4B, the second ground/power redistribution pattern 612 may be electrically connected to the second ground/power structure 320 and the fifth ground/power structure 350.

Alternatively, the first ground/power structure 310 and the fourth ground/power structure 340 may be electrically connected to one of the ground/power conductive patterns 130PG of the first redistribution substrate 100, as described with reference to FIG. 3A. The one of the ground/power conductive patterns 130PG may be the first ground/power shared pattern 1301PG of FIG. 3A. The second ground/power structure 320 and the fifth ground/power structure 350 may be electrically connected to another of the ground/power conductive patterns 130PG. The another of the ground/power conductive patterns 130PG may be the second ground/power shared pattern 1302PG described with reference to FIGS. 3A and 3B.

The semiconductor package 10B may be fabricated through a chip-first process, but example embodiments are not limited to this example.

Figure 5A:
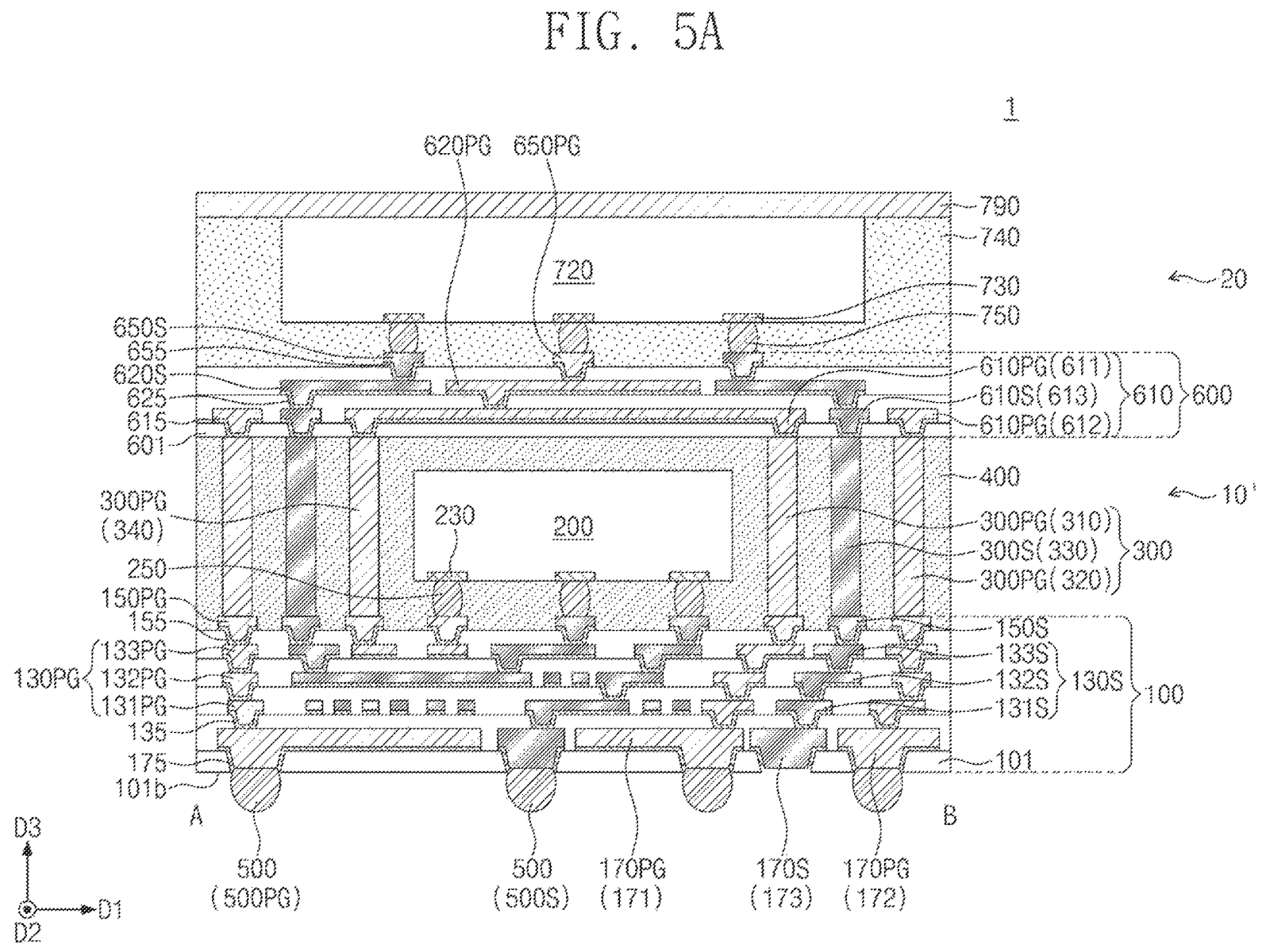
Figure 5B:
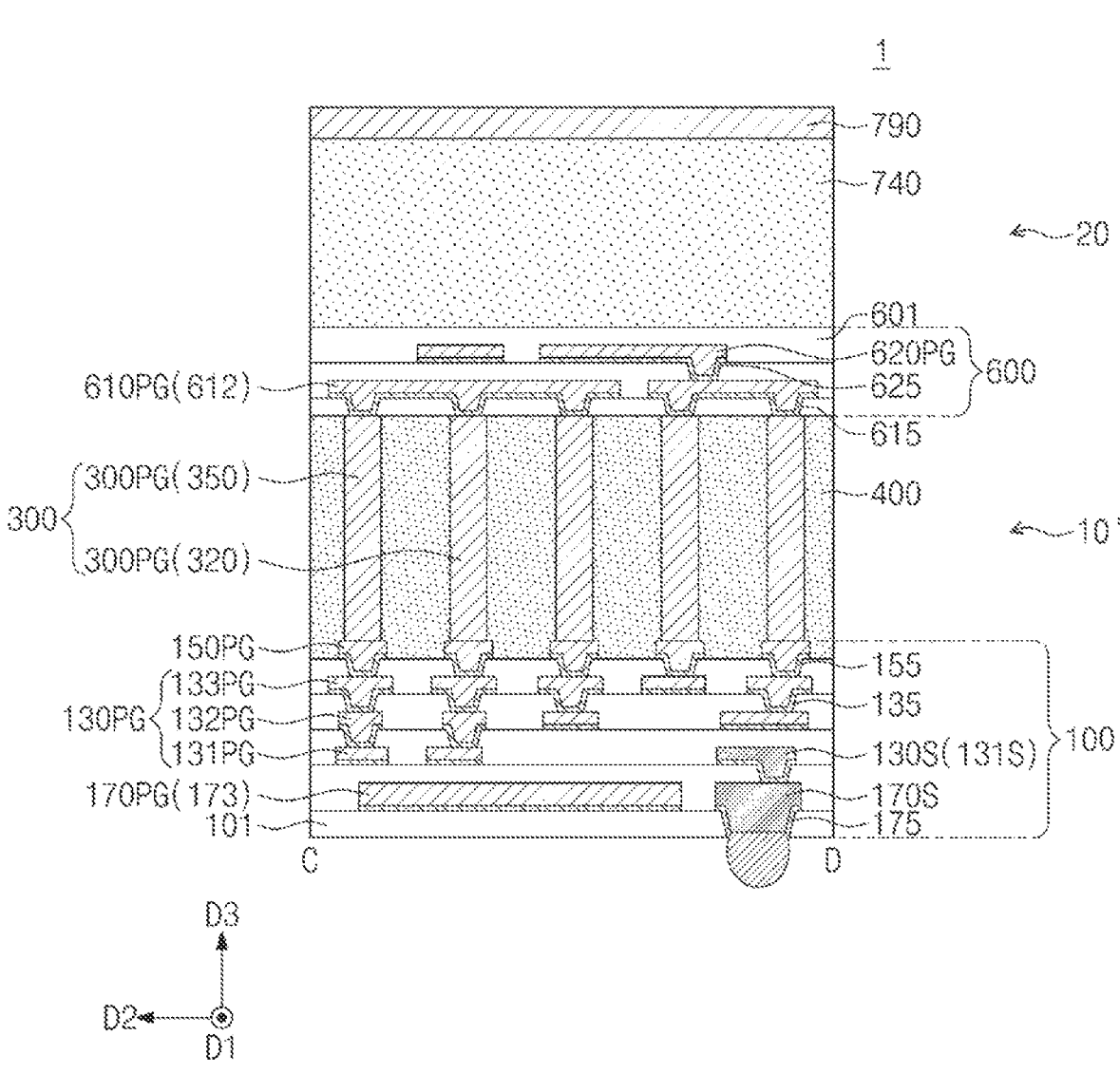

FIG. 5A is a sectional view, which is taken along the line A-B of FIG. 1A to illustrate a semiconductor package according to an example embodiment. FIG. 5B is a sectional view, which is taken along the line C-D of FIG. 1A to illustrate a semiconductor package according to an example embodiment.

Referring to FIGS. 5A and 5B, a semiconductor package 1 may include a lower package 10' and an upper package 20. The lower package 10' may be configured to have substantially the same features as the semiconductor package 10 described with reference to FIGS. 1A to 1F. The lower package 10' may include the first redistribution substrate 100, the solder balls 500, the semiconductor chip 200, the mold layer 400, the conductive structures 300, and the second redistribution substrate 600. As another example, the lower package 10' may be substantially the same as the semiconductor package 10A of FIGS. 3A and 3B or the semiconductor package 10B of FIGS. 4A and 4B.

The upper package 20 may include an upper semiconductor chip 720, upper bumps 750, and an upper mold layer 740. The upper semiconductor chip 720 may be a chip that is of a kind different from the semiconductor chip 200. As an example, the upper semiconductor chip 720 may be a memory chip, and the semiconductor chip 200 may be a logic chip. The upper semiconductor chip 720 may be mounted on a top surface of the second redistribution substrate 600. For example, the upper bumps 750 may be provided between the second redistribution substrate 600 and the upper semiconductor chip 720. The upper bumps 750 may be respectively coupled to the bonding pads 650PG and 650S and upper chip pads 730 of the upper semiconductor chip 720. The upper bumps 750 may be formed of or include a solder material. The upper bumps 750 may further include pillar patterns. The upper semiconductor chip 720 may be coupled to the semiconductor chip 200 or the solder balls 500 through the second redistribution substrate 600 and the conductive structures 300.

The upper mold layer 740 may be provided on the second redistribution substrate 600 and a side surface of the upper semiconductor chip 720. The upper mold layer 740 may further be provided on a lower surface of the upper semiconductor chip 720. The upper mold layer 740 may be directly disposed on the second redistribution substrate 600. The upper mold layer 740 may not be provided on a top surface of the upper semiconductor chip 720. The upper mold layer 740 may be formed of or include an insulating polymer (e.g., an epoxy molding compound).

The upper package 20 may further include a heat dissipation structure 790. The heat dissipation structure 790 may be disposed on the top surface of the upper semiconductor chip 720 and a top surface of the upper mold layer 740. In an example embodiment, the heat dissipation structure 790 may extend along a side surface of the upper mold layer 740. The heat dissipation structure 790 may include a heat sink, a heat slug, or a thermal interface material (TIM) layer. The heat dissipation structure 790 may be formed of or include at least one of, for example, metallic materials.

The upper package 20 may not include the heat dissipation structure 790, and the upper mold layer 740 may be provided on the top surface of the upper semiconductor chip 720.

Figure 6A:
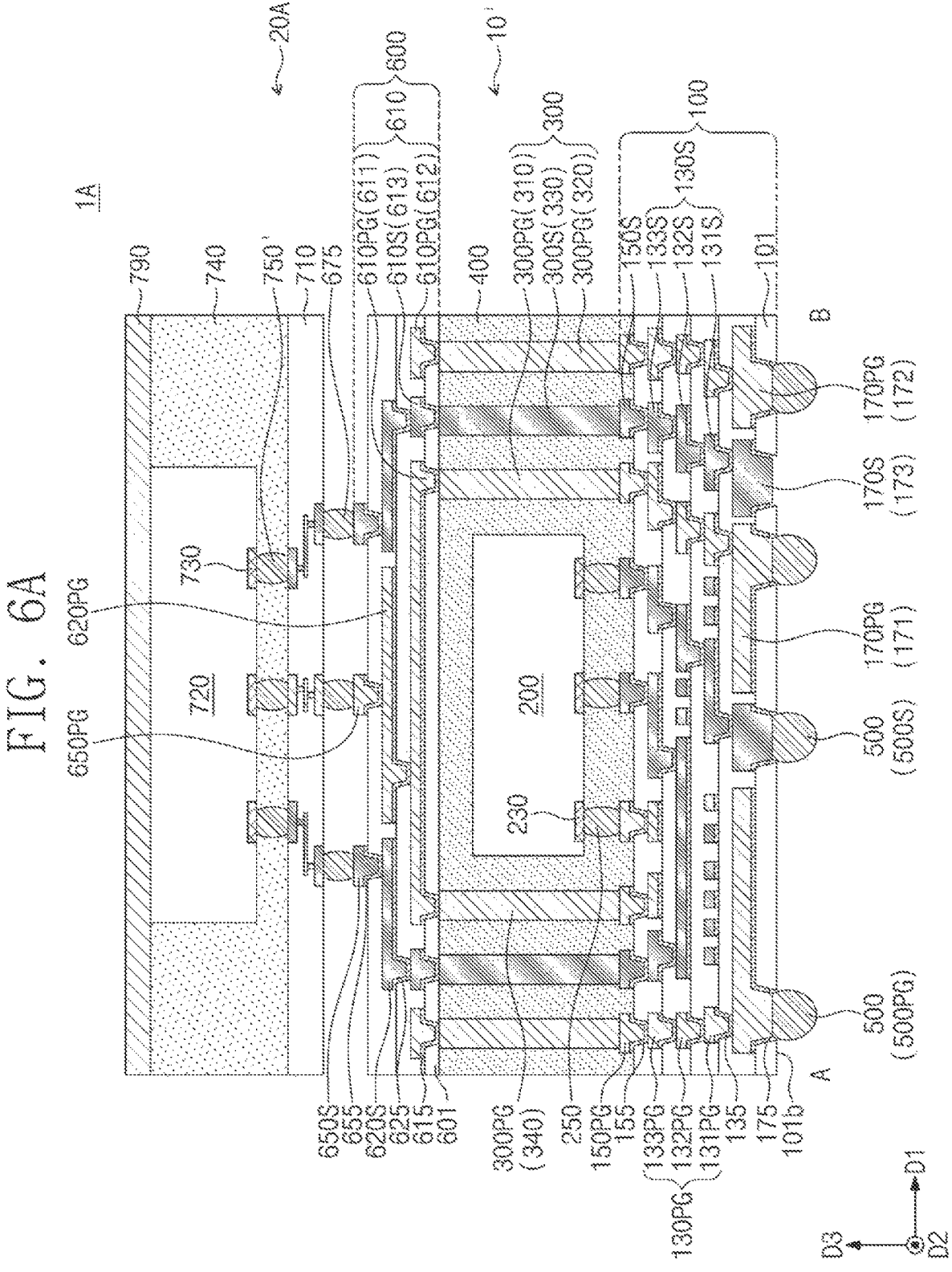
FIGS. 6A and 6B are sectional views illustrating a semiconductor package according to an example embodiment.
Figure 6B:
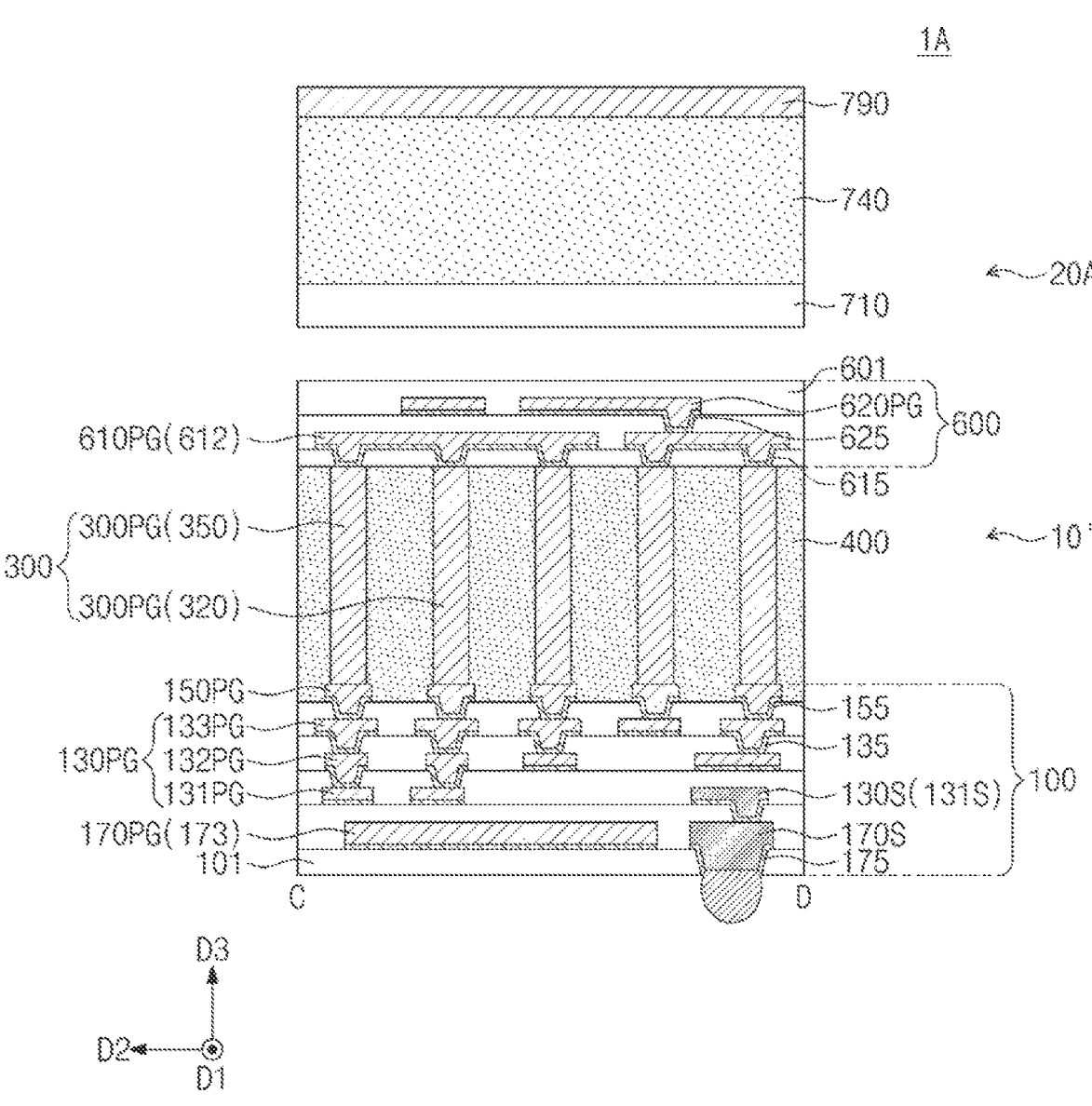

FIG. 6A is a sectional view, which is taken along the line A-B of FIG. 1A to illustrate a semiconductor package according to an example embodiment. FIG. 6B is a sectional view, which is taken along the line C-D of FIG. 1A to illustrate a semiconductor package according to an example embodiment.

Referring to FIGS. 6A and 6B, a semiconductor package 1A may include the lower package 10', the upper package 20A, and connection bumps 675. The lower package 10' may be configured to have substantially the same features as the semiconductor package 10 described with reference to FIGS. 1A to 1F. As another example, the lower package 10' may be configured to have substantially the same features as the semiconductor package 10A of FIGS. 3A and 3B or the semiconductor package 10B of FIGS. 4A and 4B.

The upper package 20A may include an upper substrate 710, the upper semiconductor chip 720, the upper bumps 750', and the upper mold layer 740. The upper substrate 710 may be disposed on and spaced apart from the top surface of the second redistribution substrate 600. The upper substrate 710 may be a printed circuit board or a redistribution layer. The upper bumps 750' may be interposed between the upper substrate 710 and the upper semiconductor chip 720, and may be coupled to the upper substrate 710 and the upper chip pads 730. An expression "an element is coupled to the upper substrate 710" may indicate that the element is electrically connected to metal lines in the upper substrate 710. The upper mold layer 740 may be provided on the upper substrate 710 and the upper semiconductor chip 720.

The connection bumps 675 may be interposed between the lower package 10' and the upper package 20A. For example, the connection bumps 675 may be interposed between the second redistribution substrate 600 and the upper substrate 710, and may be electrically connected to the bonding pads 650PG and 650S and the upper substrate 710. The connection bumps 675 may be formed of or include a solder material. The connection bumps 675 may further include metal pillar patterns, but example embodiments are not limited to this example.

The upper package 20A may further include the heat dissipation structure 790.

Figure 7A:
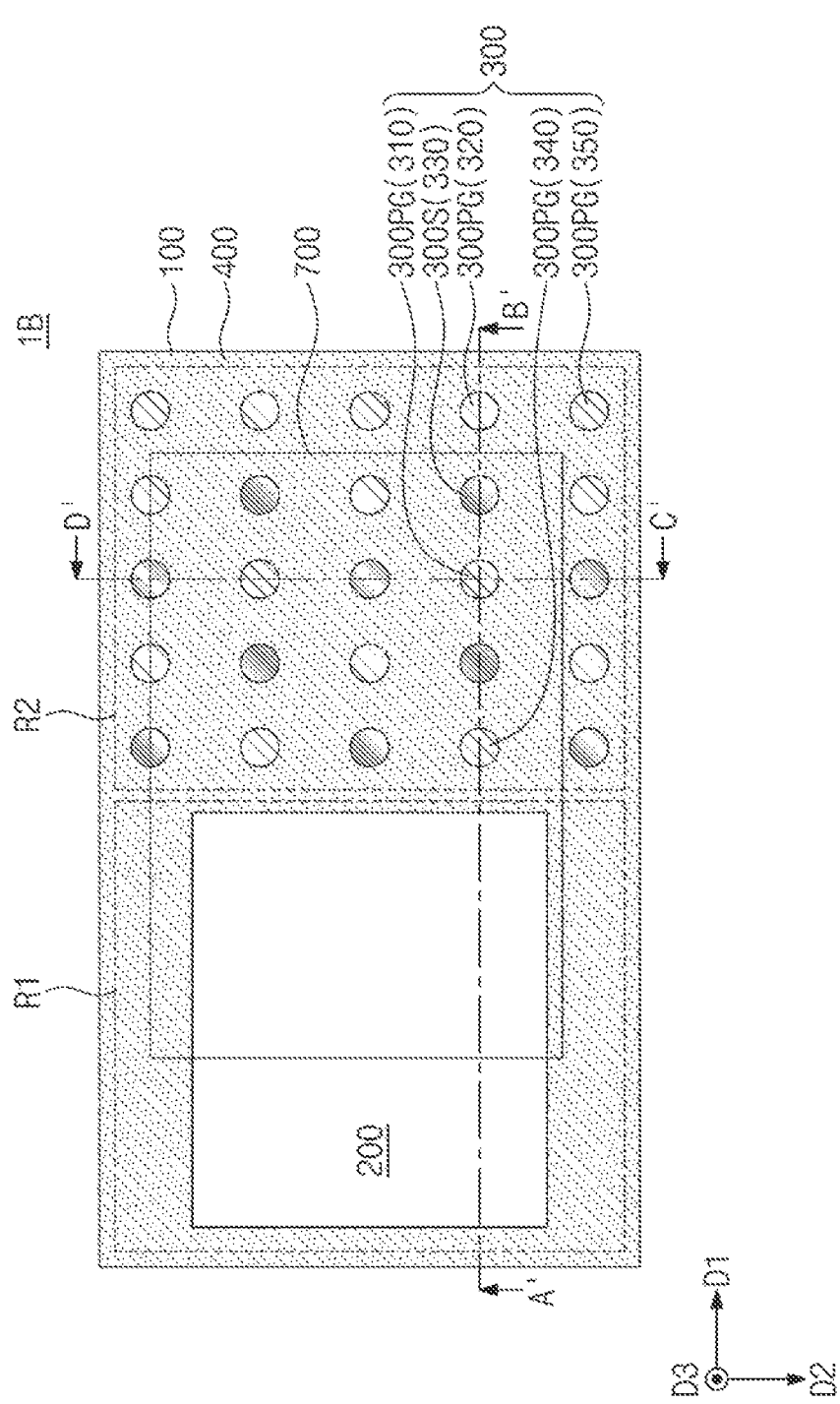
FIG. 7A is a plan view of a semiconductor package according to an example embodiment.
Figure 7B:
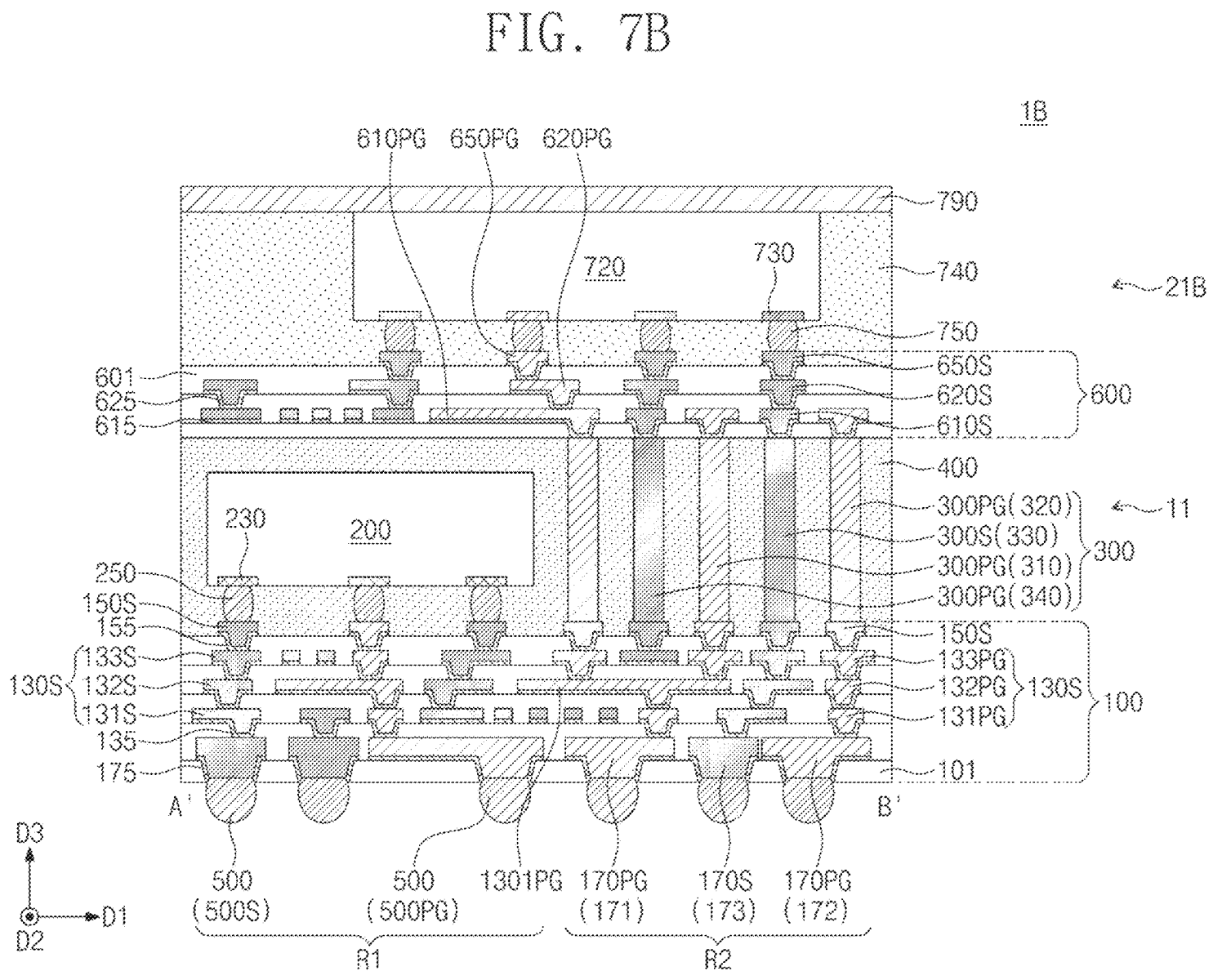
Figure 7C:
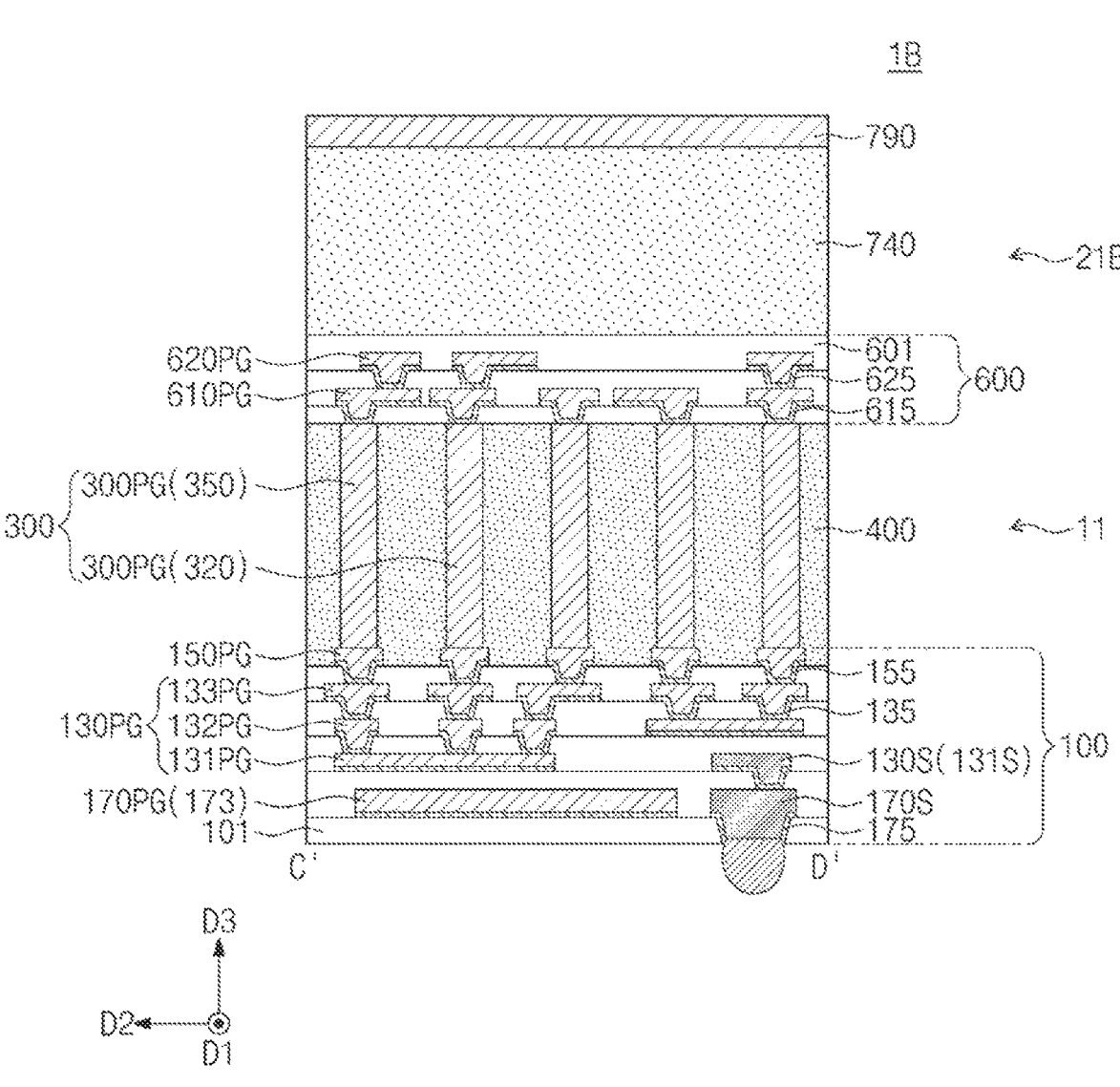
FIG. 7C is a sectional view taken along a line C'-D' of FIG. 7A.

FIG. 7A is a plan view of a semiconductor package according to an example embodiment. FIG. 7B is a sectional view taken along a line A'-B' of FIG. 7A. FIG. 7C is a sectional view taken along a line C'-D' of FIG. 7A.

Referring to FIGS. 7A, 7B, and 7C, a semiconductor package 1B may include a lower package 11 and an upper package 21B. The lower package 11 may include the first redistribution substrate 100, the solder balls 500, the semiconductor chip 200, the conductive structures 300, the mold layer 400, and the second redistribution substrate 600. The upper package 21B may include the upper semiconductor chip 720, the upper bumps 750, and the upper mold layer 740. The upper package 21B may further include the heat dissipation structure 790.

The first redistribution substrate 100 may have a first region R1 and a second region R2, when viewed in a plan view. The first region R1 of the first redistribution substrate 100 may be adjacent to a first side surface of the first redistribution substrate 100. The second region R2 of the first redistribution substrate 100 may be adjacent to a second side surface of the first redistribution substrate 100. For example, the second region R2 of the first redistribution substrate 100 may be provided between the first region R1 and the second side surface. The second side surface of the first redistribution substrate 100 may be opposite to the first side surface.

The semiconductor chip 200 may be disposed on a top surface of the first region R1 of the first redistribution substrate 100. The conductive structures 300 may be disposed on a top surface of the second region R2 of the first redistribution substrate 100.

The upper semiconductor chip 720 may be disposed on the second redistribution substrate 600 and may be overlapped with the first and second regions R1 and R2 of the first redistribution substrate 100, when viewed in a plan view. At least a portion of the upper semiconductor chip 720 may be vertically overlapped (i.e., along the third direction D3) with the conductive structures 300. The upper chip pads 730 may be vertically overlapped with the second region R2 of the first redistribution substrate 100. Accordingly, a length of an electric conduction path between the upper semiconductor chip 720 and the conductive structures 300 may be reduced. The semiconductor package 1B may exhibit improved electric characteristics.

Figure 8A:
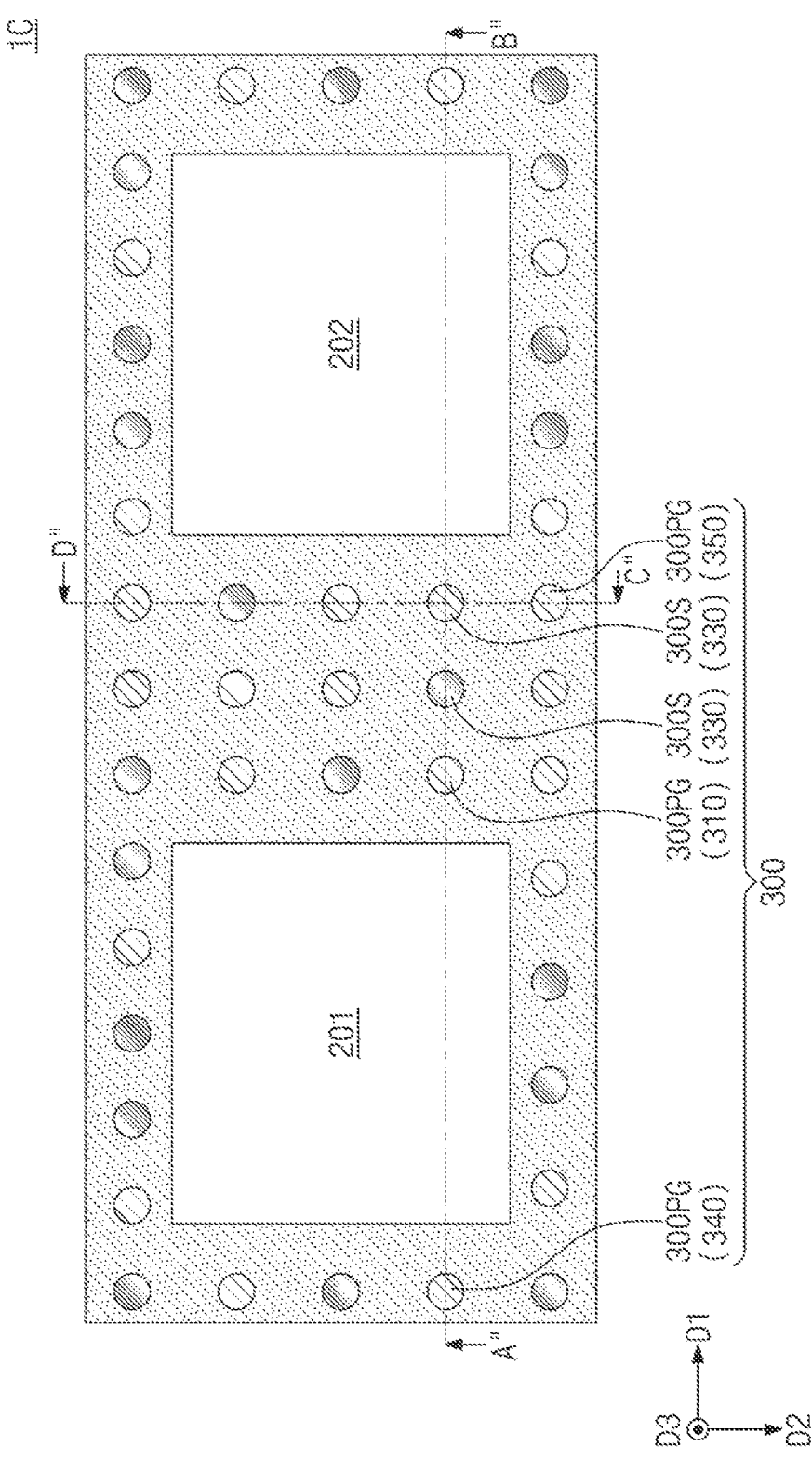
FIG. 8A is a plan view of a semiconductor package according to an example embodiment.
Figure 8B:
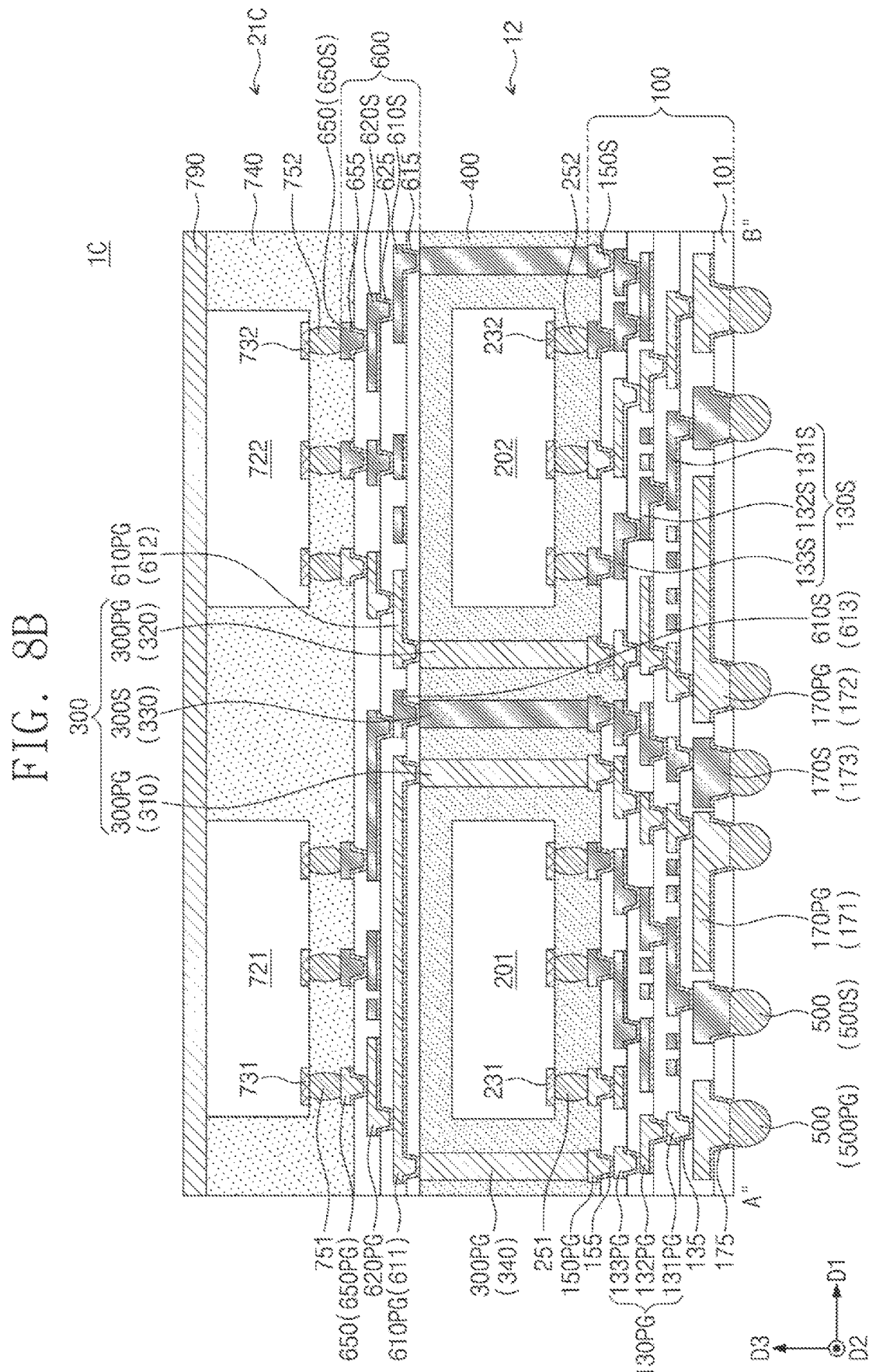
FIG. 8B is a sectional view taken along a line A"-B" of FIG. 8A.
Figure 8C:
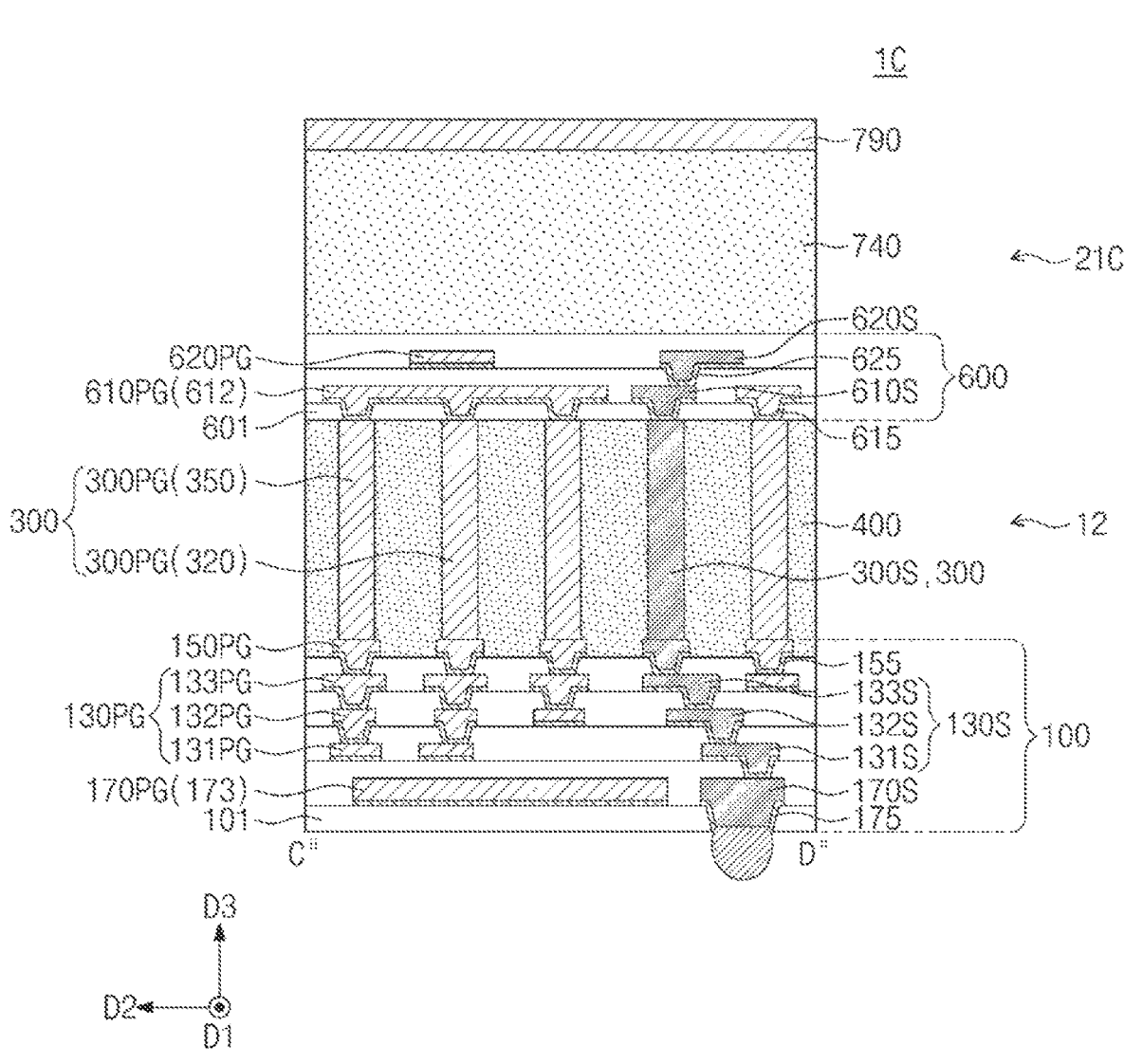
FIG. 8C is a sectional view taken along line a line C"-D' of FIG. 8A.

FIG. 8A is a plan view of a semiconductor package according to an example embodiment. FIG. 8B is a sectional view taken along a line A"-B" of FIG. 8A. FIG. 8C is a sectional view taken along line a line C"-D" of FIG. 8A.

Referring to FIGS. 8A, 8B, and 8C, a semiconductor package 1C may include a lower package 12 and an upper package 21C. The lower package 12 may include the first redistribution substrate 100, the solder balls 500, a first semiconductor chip 201, a second semiconductor chip 202, the conductive structures 300, the mold layer 400, and the second redistribution substrate 600. Each of the first and second semiconductor chips 201 and 202 may be provided to have the same or similar features as the semiconductor chip 200 described with reference to FIG. 1D. The second semiconductor chip 202 may be laterally spaced apart from the first semiconductor chip 201. The second semiconductor chip 202 may be of the same kind as the first semiconductor chip 201 or may be of a different kind from the first semiconductor chip 201. First bumps 251 may be provided between the first redistribution substrate 100 and the first semiconductor chip 201 and may be coupled to the redistribution pads 150PG and 150S and the chip pads 231 of the first semiconductor chip 201. Second bumps 252 may be provided between the first redistribution substrate 100 and the second semiconductor chip 202 and may be coupled to the redistribution pads 150PG and 150S and the chip pads 232 of the second semiconductor chip 202. The first bumps 251 and the second bumps 252 may be provided to have the same or similar features as the bumps 250 described with reference to FIG. 1D.

The conductive structures 300 may be spaced apart from the first and second semiconductor chips 201 and 202 and may be provided to enclose the first and second semiconductor chips 201 and 202, when viewed in a plan view. For example, the conductive structures 300 may be provided between the first and second semiconductor chips 201 and 202.

The upper package 21C may include a first upper semiconductor chip 721, a second upper semiconductor chip 722, first upper bumps 751, second upper bumps 752, and the upper mold layer 740. The upper package 21C may further include the heat dissipation structure 790.

Each of the first and second upper semiconductor chips 721 and 722 may be provided to have the same or similar features as the upper semiconductor chip 720 described with reference to FIG. 5A. For example, the first and second upper semiconductor chips 721 and 722 may be mounted on the second redistribution substrate 600. The first upper bumps 751 may be provided between the second redistribution substrate 600 and the first upper semiconductor chip 721 and may be coupled to the bonding pads 650PG and 650S and first upper chip pads 731 of the first upper semiconductor chip 721. The first upper semiconductor chip 721 may be electrically connected to the first and second semiconductor chips 201 and 202 and the solder balls 500 through the conductive structures 300. The first upper semiconductor chip 721 may be of the same kind as the first and second semiconductor chips 201 and 202 or may be of a different kind from the first and second semiconductor chips 201 and 202.

The second upper semiconductor chip 722 may be laterally spaced apart from the first upper semiconductor chip 721. The second upper bumps 752 may be provided between the second redistribution substrate 600 and the second upper semiconductor chip 722 and may be coupled to the bonding pads 650PG and 650S and second upper chip pads 732 of the second upper semiconductor chip 722. The first upper bumps 751 and the second upper bumps 752 may be provided to have the same or similar features as the upper bumps 750 described with reference to FIG. 5A. The second upper semiconductor chip 722 may be electrically connected to the first and second semiconductor chips 201 and 202 and the solder balls 500 through the conductive structures 300. The second upper semiconductor chip 722 may be of the same kind as the first upper semiconductor chip 721 or may be of a different kind from the first upper semiconductor chip 721.

The afore-described example embodiments may be combined with each other. For example, the semiconductor package 10 of FIGS. 1A to 1F, the semiconductor package 10A of FIGS. 3A and 3B, at least two packages, which are chosen from the semiconductor package 10B of FIGS. 4A and 4B, the semiconductor package 1 of FIGS. 5A and 5B, the semiconductor package 1A of FIGS. 6A and 6B, the semiconductor package 1B of FIGS. 7A and 7B, and the semiconductor package 1C of FIGS. 8A and 8B, may be combined. As an example, the semiconductor package 1B of FIGS. 7A and 7B may be configured to include the upper package 20, which is included in the semiconductor package 1 described with reference to FIGS. 5A and 5B.

FIGS. 9A to 9L are sectional views illustrating a method of fabricating a semiconductor package according to an example embodiment.

Figure 9A:
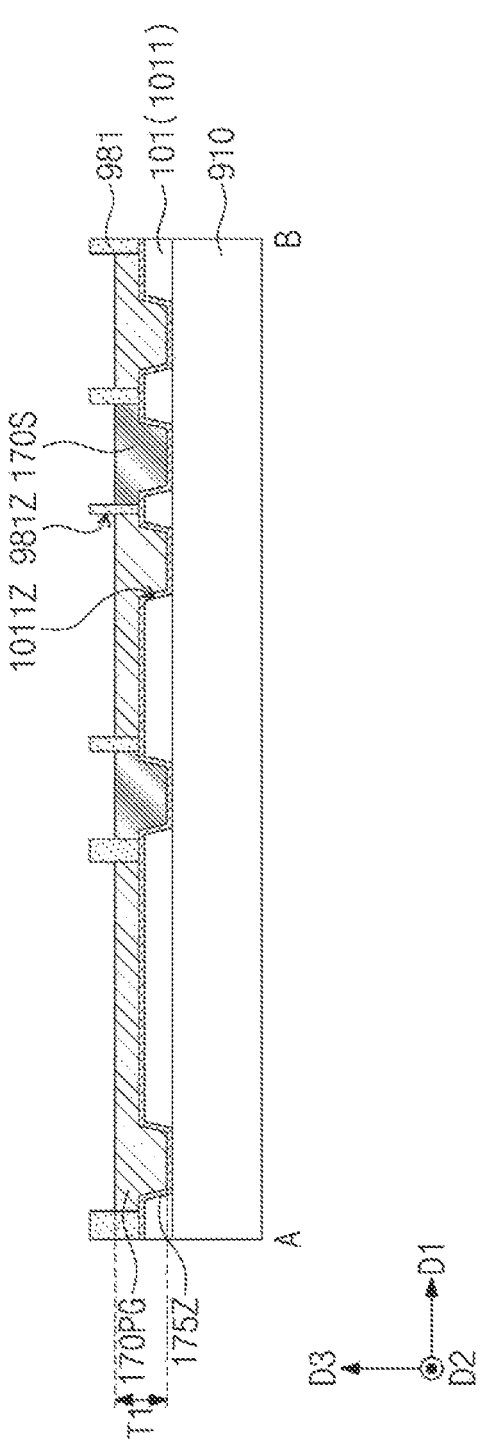

Referring to FIG. 9A, the first insulating layer 101, an under-bump seed layer 175Z, a first resist pattern 981, and the under-bump patterns 170PG and 170S may be formed on a carrier substrate 910. The formation of the first insulating layer 101 may include coating a photosensitive polymer. The first insulating layer 101 may be patterned to form first openings 1011Z in the first insulating layers 101. The first openings 1011Z may be formed to expose a top surface of the carrier substrate 910 and inner side surfaces of the first insulating layer 101. The first insulating layer 101 may be a first sub-insulating layer 1011.

The under-bump seed layer 175Z may be formed on the exposed top surface of the carrier substrate 910 and the first sub-insulating layer 1011. For example, the under-bump seed layer 175Z may be formed conformally on inner side surfaces and a top surface of the first sub-insulating layer 1011. The under-bump seed layer 175Z may be formed by a deposition process.

The first resist pattern 981 may be formed on the top surface of the first insulating layer 101 and the under-bump seed layer 175Z. First guide openings 981Z may be formed in the first resist pattern 981 to expose the under-bump seed layer 175Z. The first guide openings 981Z may be vertically overlapped with the first openings 1011Z. A width of each of the first guide openings 981Z may be larger than a width of the corresponding one of the first openings 1011Z.

The under-bump patterns 170PG and 170S may be formed in the first openings 1011Z and the first guide openings 981Z, respectively, and on the under-bump seed layer 175Z. The under-bump patterns 170PG and 170S may be formed by performing an electroplating process using the under-bump seed layer 175Z as an electrode. The electroplating process for forming the under-bump patterns 170PG and 170S may be finished before the under-bump patterns 170PG and 170S reach a top surface of the first resist pattern 981. Accordingly, top surfaces of the under-bump patterns 170PG and 170S may be lower than the top surface of the first resist pattern 981, and during the process of forming the under-bump patterns 170PG and 170S, it may be unnecessary to perform a separate planarization process.

The lower portions of the under-bump patterns 170PG and 170S may be provided in the first openings 1011Z, and the upper portions of the under-bump patterns 170PG and 170S may be provided in the first guide openings 981Z. Because the width of the first guide opening 981Z is larger than the width of the first opening 1011Z, the upper portion of the under-bump pattern 170PG or 170S may have a width larger than that of the lower portion thereof.

In the case where the under-bump seed patterns 175 are formed on a single flat surface and have a flat top surface, it may be difficult to form the under-bump patterns 170PG and 170S to a large thickness. According to an example embodiment, the under-bump seed layer 175Z may be conformally formed on bottom surfaces of the first openings 1011Z and the side and top surfaces of the first sub-insulating layer 1011. Because the under-bump patterns 170PG and 170S are formed using the under-bump seed layer 175Z as an electrode, it may be possible to easily form the under-bump patterns 170PG and 170S to a relatively large thickness T1.

The under-bump patterns 170PG and 170S may include the signal under-bump patterns 170S and the ground/power under-bump patterns 170PG. Because the under-bump patterns 170PG and 170S are formed using the first resist pattern 981, the under-bump patterns 170PG and 170S may be laterally spaced apart from each other, without an additional patterning process. Accordingly, it may be possible to simplify the process of forming the under-bump patterns 170PG and 170S.

Figure 9B:
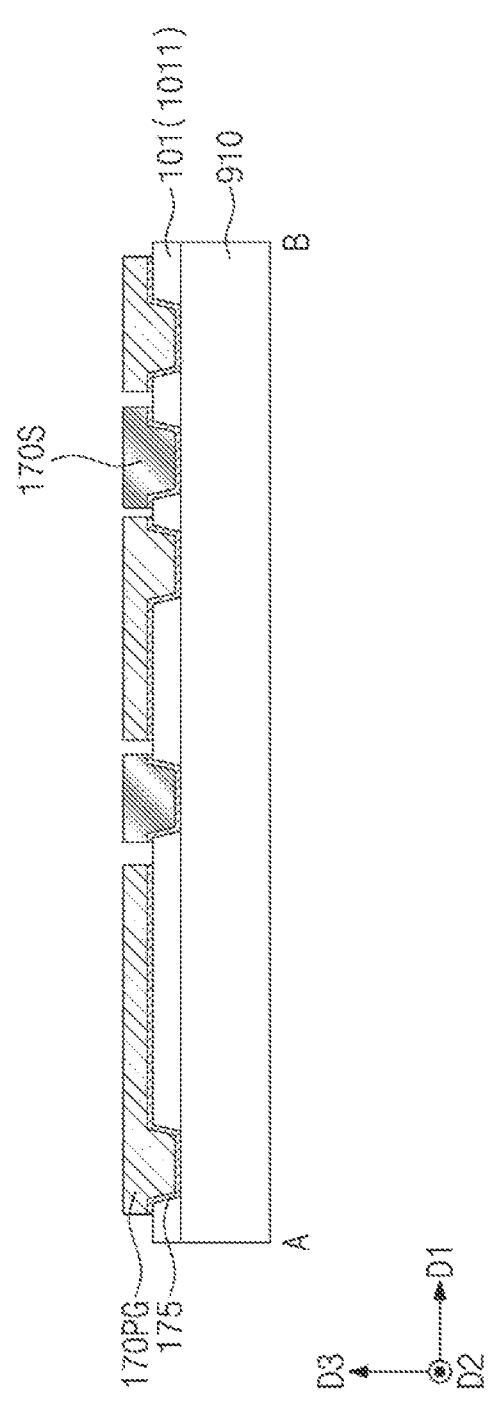

Referring to FIG. 9B, the first resist pattern 981 may be removed to expose first portions of the under-bump seed layer 175Z. In an example embodiment, the first resist pattern 981 may be removed by a strip process.

The first sub-insulating layer 1011 may be exposed by removing the exposed first portions of the under-bump seed layer 175Z through an etching process. Second portions of the under-bump seed layer 175Z may be provided under the bottom surfaces 170b of the under-bump patterns 170PG and 170S, respectively, and may not be exposed to the etching process. Accordingly, the second portions of the under-bump seed layer 175Z may not be removed by the etching process and may be left. After the etching process, the left second portions of the under-bump seed layer 175Z may form the under-bump seed patterns 175. The under-bump seed patterns 175 may be spaced apart from each other and may be electrically separated from each other.

Figure 9C:
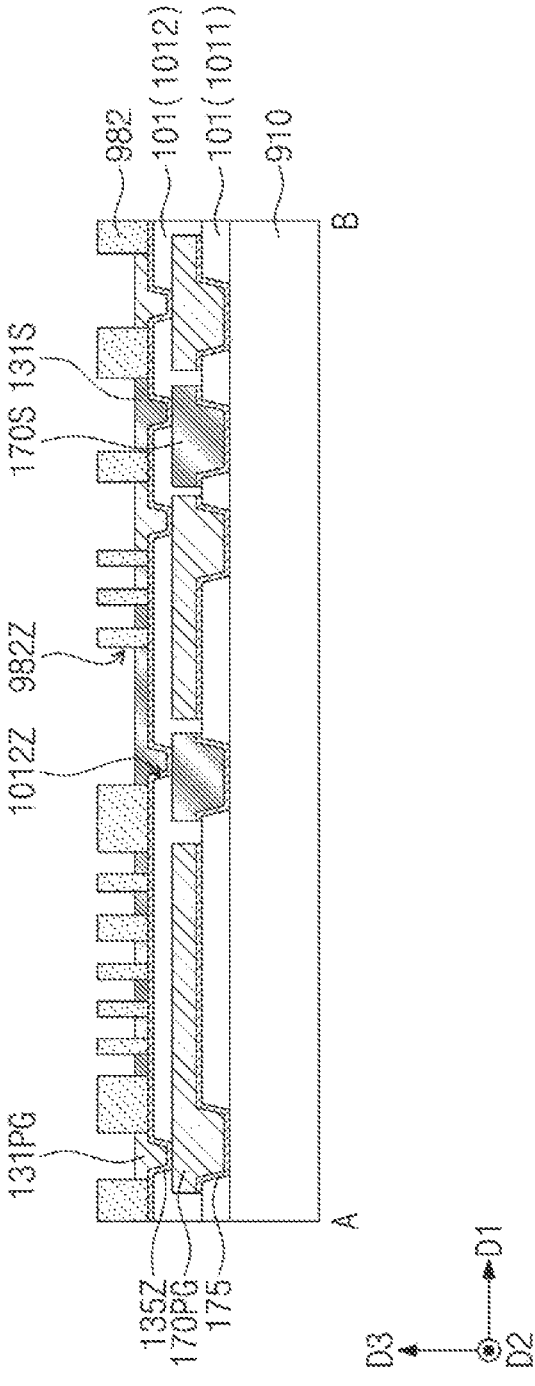

Referring to FIG. 9C, a second sub-insulating layer 1012 may be formed on the first sub-insulating layer 1011 and the under-bump patterns 170PG and 170S to, for example, cover the under-bump patterns 170PG and 170S.

The second sub-insulating layer 1012 may be patterned to form second openings 1012Z in the second sub-insulating layer 1012. The patterning of the second sub-insulating layer 1012 may be performed by an exposure process and a developing process. The second openings 1012Z may be formed to expose the top surfaces of the under-bump patterns 170PG and 170S, respectively.

A first seed layer 135Z, a second resist pattern 982, the first ground/power conductive patterns 131PG, and the first signal conductive patterns 131S may be formed on the second sub-insulating layer 1012. In an example embodiment, the first seed layer 135Z may be conformally formed on the second sub-insulating layer 1012 and in the second openings 1012Z.

The second resist pattern 982 may be formed on the first seed layer 135Z. The second resist pattern 982 may be patterned to form second guide openings 982Z. The second guide openings 982Z may be connected to the second openings 1012Z, respectively. Widths of the second guide openings 982Z may be larger than widths of the corresponding second openings 1012Z. Each of the second guide openings 982Z may be formed to expose the first seed layer 135Z.

The first ground/power conductive patterns 131PG and the first signal conductive patterns 131S may be formed in the second openings 1012Z to be provided on the first seed layer 135Z. For example, each of the first ground/power conductive patterns 131PG and the first signal conductive patterns 131S may be formed to fill a corresponding one of the second openings 1012Z. Each of the first ground/power conductive patterns 131PG and the first signal conductive patterns 131S may be formed in lower portions of the corresponding second guide openings 982Z and may not extend to a region on a top surface of the second resist pattern 982. The first ground/power conductive patterns 131PG and the first signal conductive patterns 131S may be formed by performing an electroplating process using the first seed layer 135Z as an electrode. In an example embodiment, a separate planarization process may not be performed during the process of forming the first ground/power conductive patterns 131PG and the first signal conductive patterns 131S.

The first ground/power conductive patterns 131PG and the first signal conductive patterns 131S may be laterally spaced apart from each other. Because the first ground/power conductive patterns 131PG and the first signal conductive patterns 131S are formed using the second resist pattern 982, it may be unnecessary to perform a separate etching process for separating the first ground/power conductive patterns 131PG from the first signal conductive patterns 131S. Accordingly, it may be possible to simplify the process of forming the first ground/power conductive patterns 131PG and the first signal conductive patterns 131S.

Figure 9D:
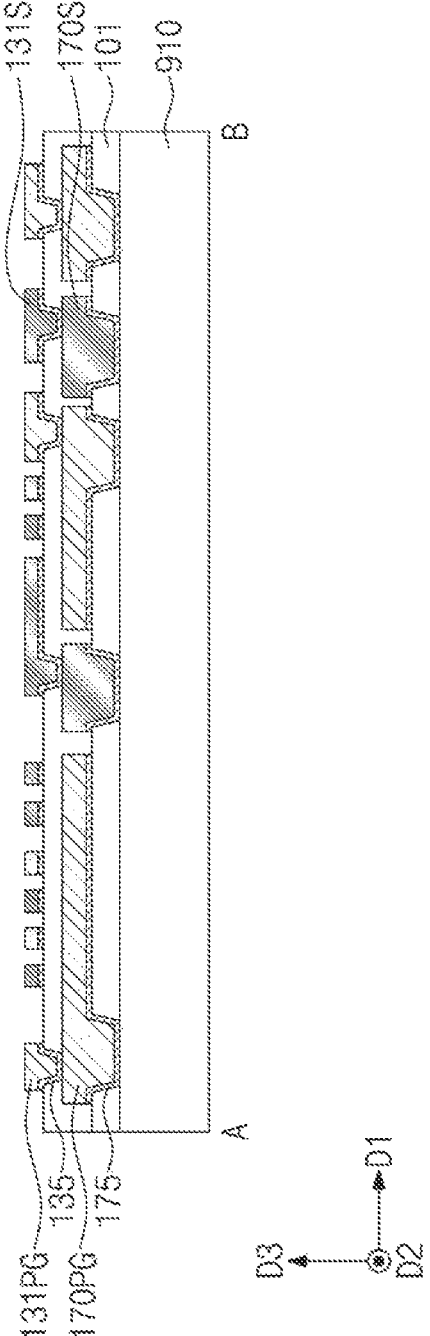

Referring to FIGS. 9C and 9D, the second resist pattern 982 may be removed to expose top surfaces of first portions of the first seed layer 135Z. Thereafter, the first seed pattern 135 may be formed by removing the exposed first portions of the first seed layer 135Z through an etching process. The etching process may be a wet etching process. The first ground/power conductive patterns 131PG and the first signal conductive patterns 131S may have an etch selectivity with respect to the first seed layer 135Z in the etching process. Second portions of the first seed layer 135Z may be disposed under the bottom surfaces of the first ground/power conductive patterns 131PG or the first signal conductive patterns 131S and may be exposed to the etching process. After the etching process, the left second portions of the first seed layer 135Z may form a plurality of the first seed patterns 135. The first seed patterns 135 may be spaced apart from each other.

Figure 9E:
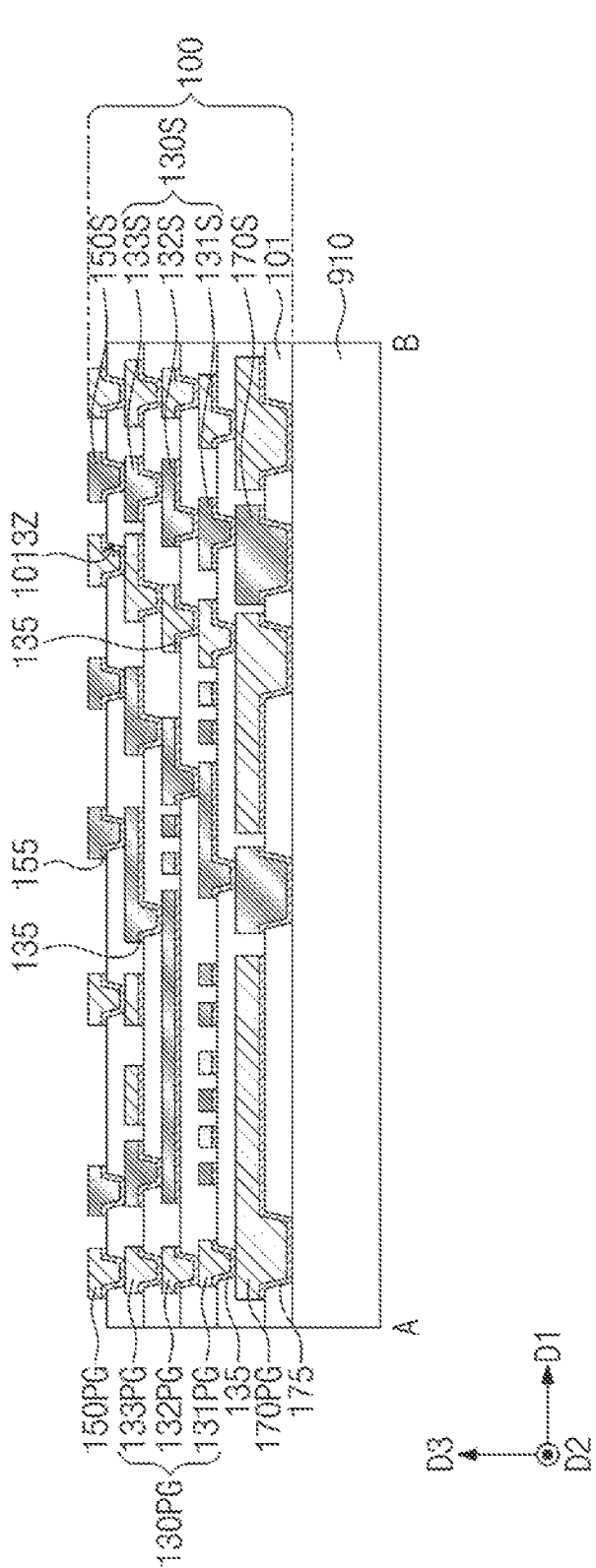

Referring to FIG. 9E, a plurality of the stacked first insulating layers 101 may be formed by repeating a process of forming the first insulating layer 101. The second ground/power conductive patterns 132PG, the second signal conductive patterns 132S, the third ground/power conductive patterns 133PG, the third signal conductive patterns 133S, the ground/power redistribution pads 150PG, and the signal redistribution pads 150S may be formed on the first ground/power conductive patterns 131PG and the first signal conductive patterns 131S. For example, the first seed patterns 135 may be formed under the bottom surfaces of the second ground/power conductive patterns 132PG, the second signal conductive patterns 132S, the third ground/power conductive patterns 133PG, and the third signal conductive patterns 133S. In an example embodiment, the second ground/power conductive patterns 132PG and the second signal conductive patterns 132S may be formed by the same method as the method for forming the first ground/power conductive patterns 131PG and the first signal conductive patterns 131S described with reference to FIGS. 9C and 9D. In an example embodiment, the third ground/power conductive patterns 133PG and the third signal conductive patterns 133S may be formed by the same method as that for the first ground/power conductive patterns 131PG and the first signal conductive patterns 131S, respectively, described with reference to FIGS. 9C and 9D. Accordingly, the ground/power conductive patterns 130PG including the first to third ground/power conductive patterns 131PG, 132PG, and 133PG may be formed, and the signal conductive patterns 130S including the first to third signal conductive patterns 131S, 132S, and 133S may be formed.

Third openings 1013Z may be formed in the uppermost one of the first insulating layers 101. The seed pads 155 may be formed in the third openings 1013Z, respectively. The seed pads 155 may extend to a region on the top surface of the uppermost one of the first insulating layers 101. The first redistribution pads 150PG and 150S may be formed by performing an electroplating process using the seed pads 155 as an electrode. Accordingly, the first redistribution substrate 100 may be fabricated. The first redistribution substrate 100 may include the first insulating layers 101, the under-bump patterns 170PG and 170S, the first seed patterns 135, the ground/power conductive patterns 130PG, the signal conductive patterns 130S, the seed pads 155, and the redistribution pads 150PG and 150S.

Figure 9F:
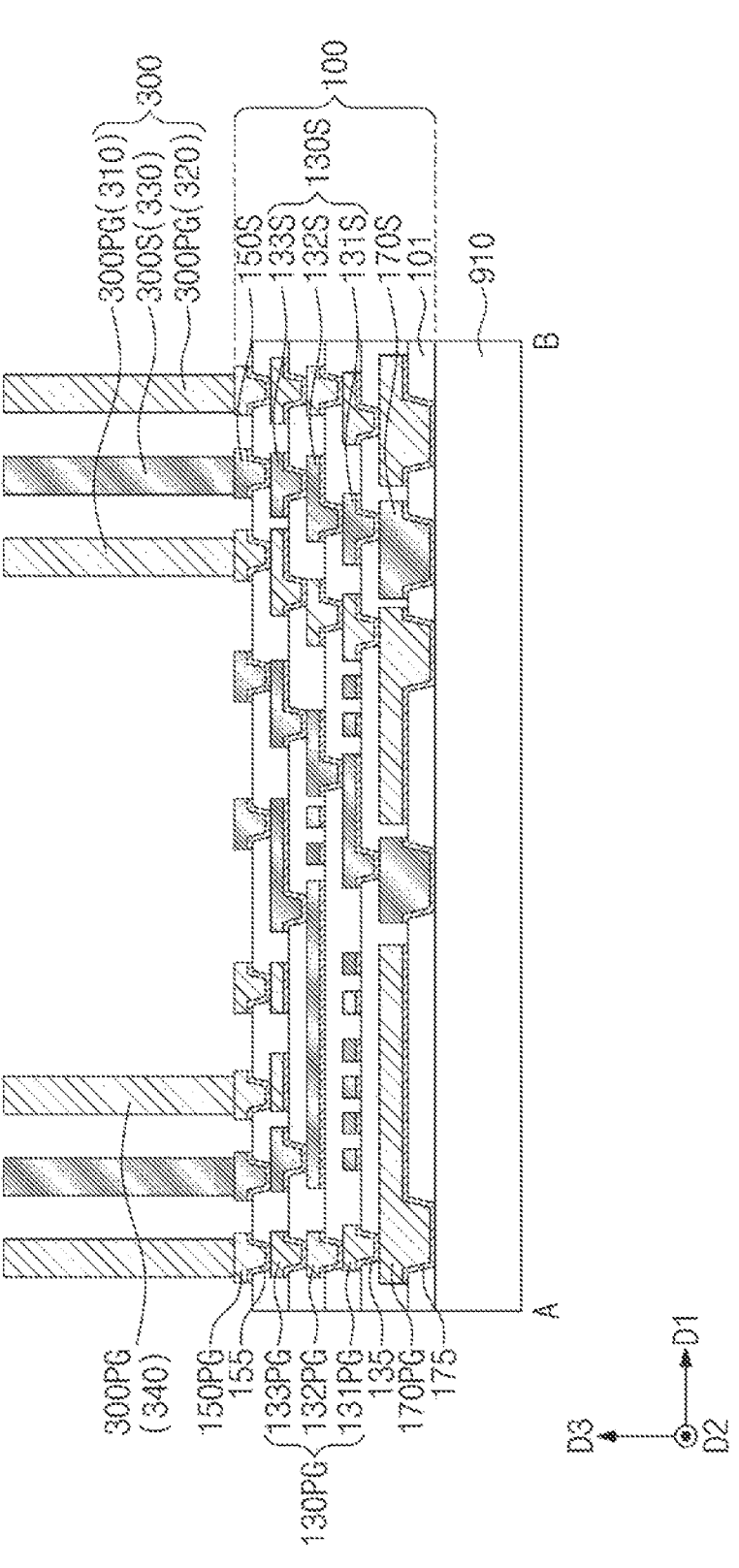

Referring to FIG. 9F, the conductive structures 300 may be formed on the redistribution pads 150PG and 150S. In an example embodiment, the conductive structures 300 may be formed by an electroplating process. The conductive structures 300 may include the ground/power structures 300PG and the signal structures 300S.

Figure 9G:
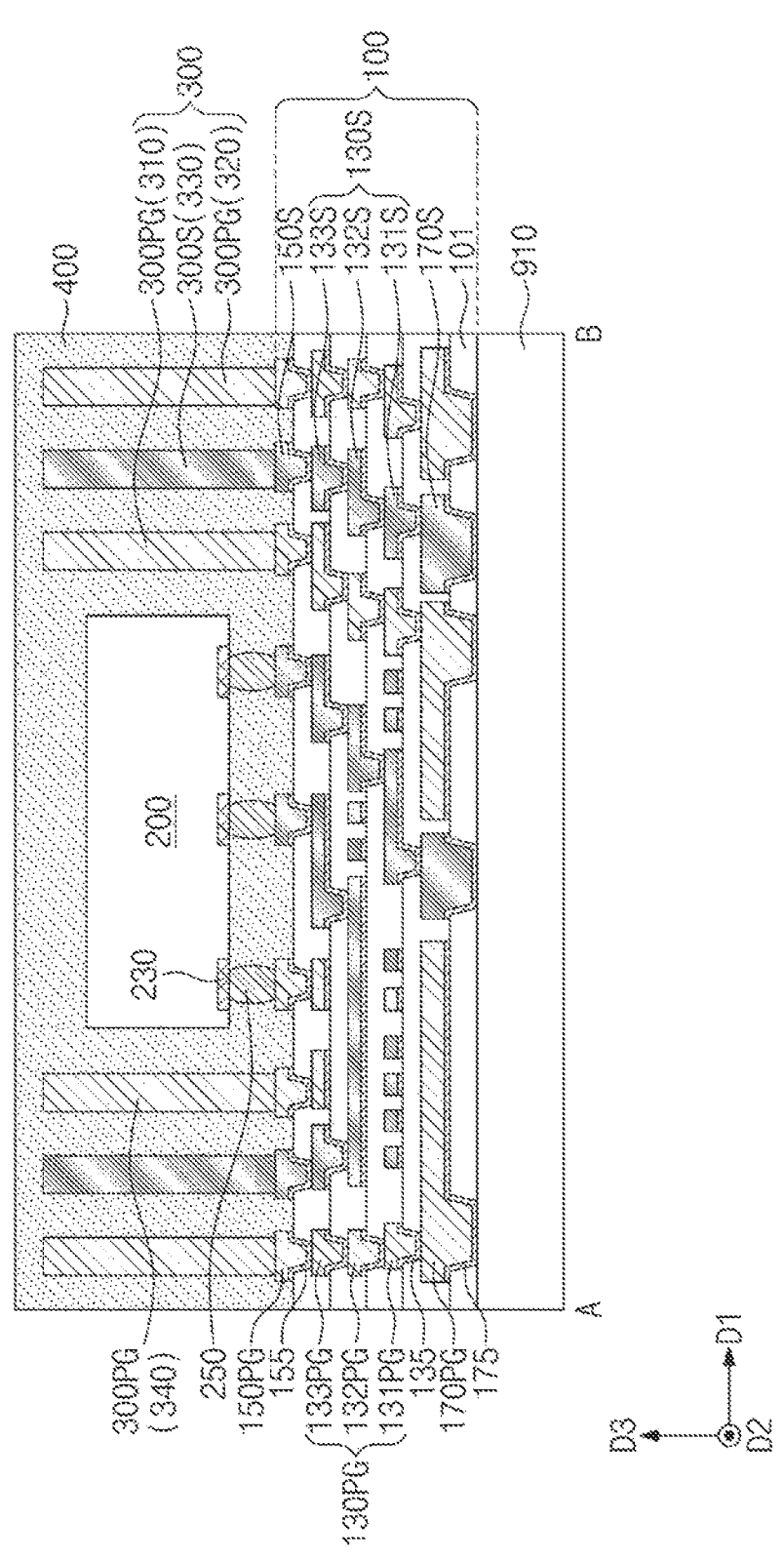

Referring to FIG. 9G, the semiconductor chip 200 may be mounted on the top surface of the first redistribution substrate 100. The mounting of the semiconductor chip 200 may include forming the bumps 250 between the first redistribution substrate 100 and the semiconductor chip 200.

The mold layer 400 may be formed on the top surface of the first redistribution substrate 100 to be provided on the semiconductor chip 200 and the conductive structures 300. The top surface of the mold layer 400 may be provided at a level higher than the top surfaces of the conductive structures 300.

Figure 9H:
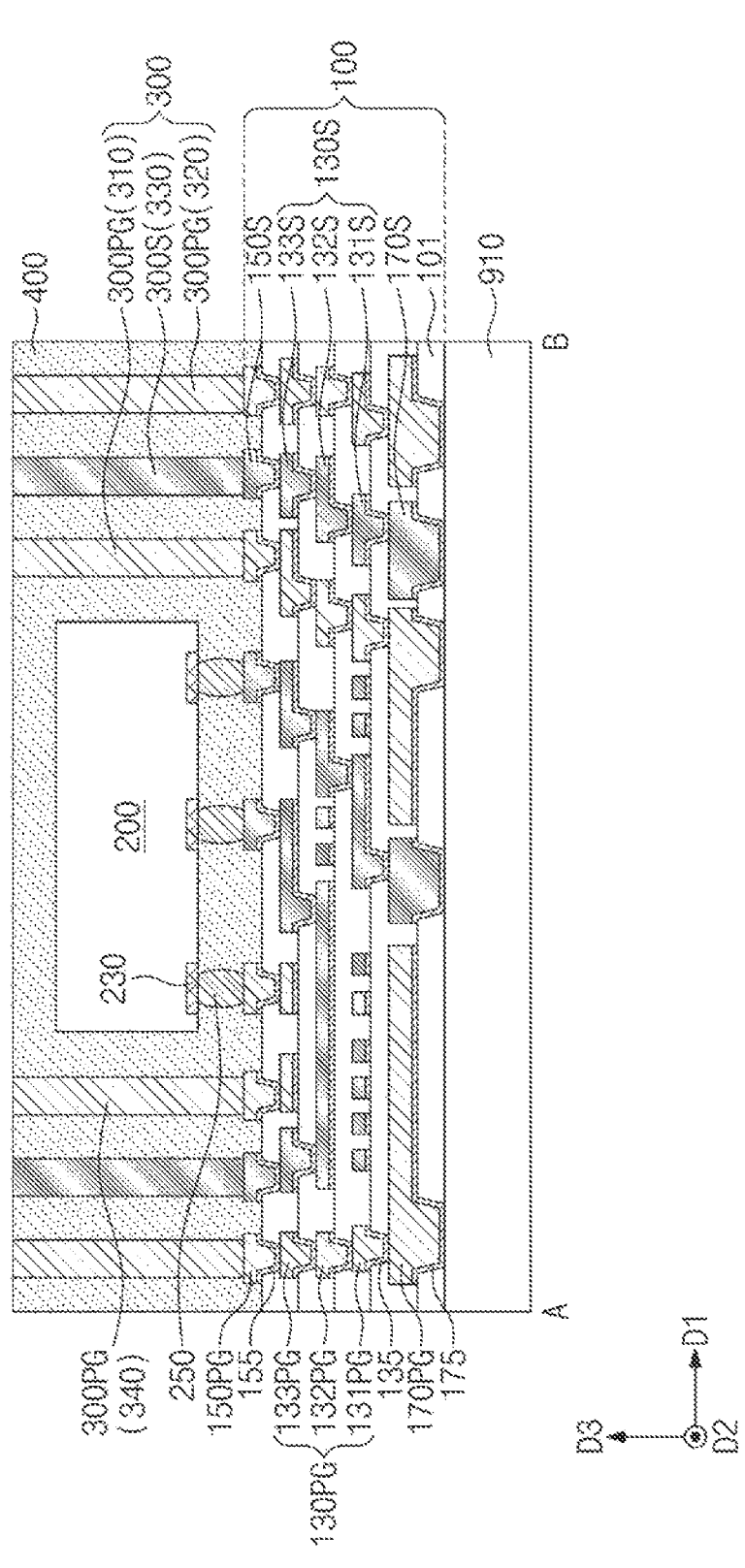
Figure 91:
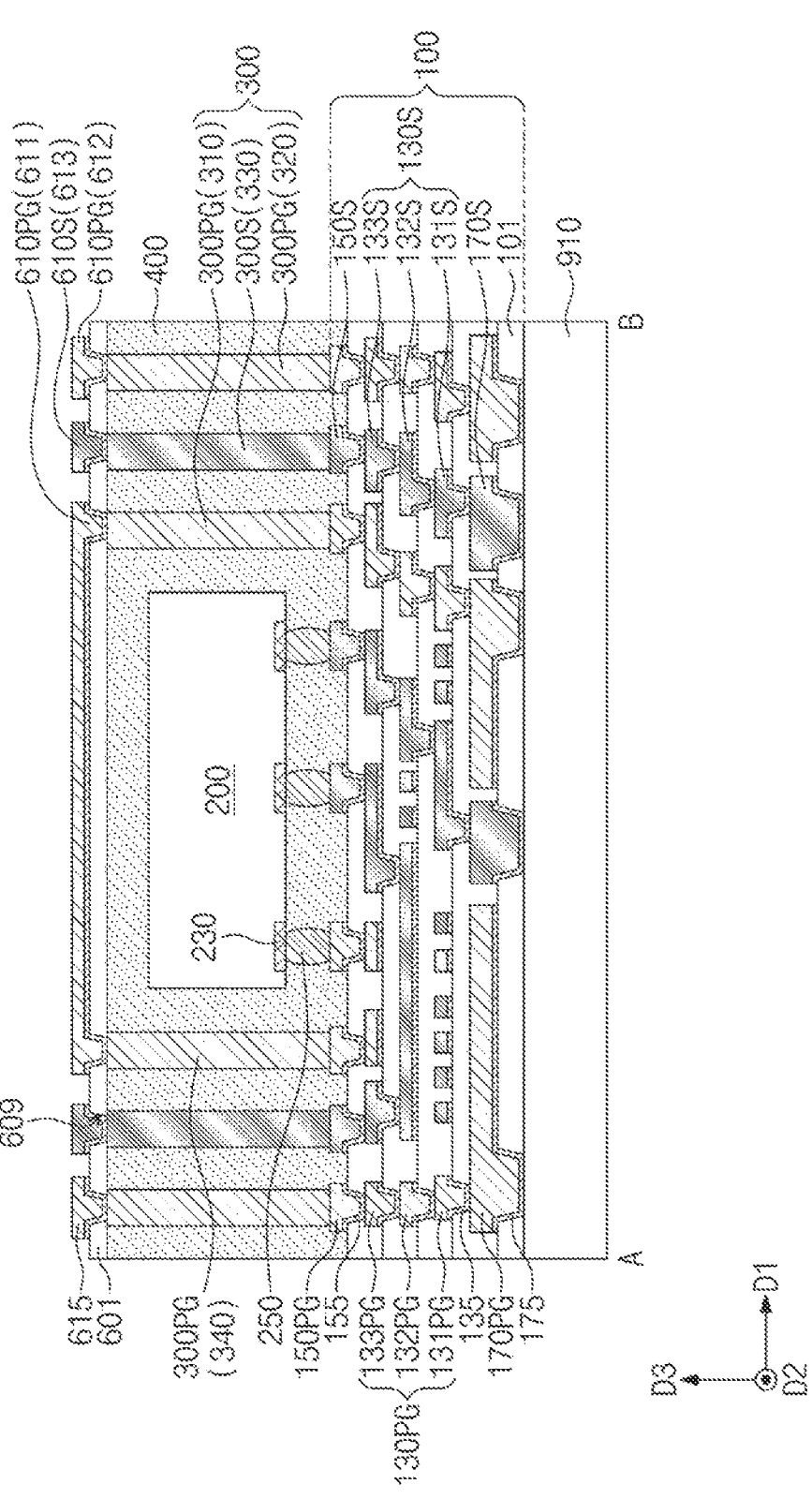

Referring to FIG. 9H, a grinding process may be performed on the mold layer 400. For example, the grinding process may include a chemical mechanical polishing process. As a result of the grinding process, the top surfaces of the conductive structures 300 may be exposed. A top surface of the mold layer 400, on which the grinding process is performed, may be coplanar with the top surfaces of the conductive structures 300.

Referring to FIG. 9I, the second insulating layer 601, the second seed patterns 615, the lower signal redistribution patterns 610S, and the lower ground/power redistribution patterns 610PG may be formed on the mold layer 400. For example, the second insulating layer 601 may be directly formed on the top surface of the mold layer 400. Upper openings 609 may be formed in the second insulating layer 601 to expose the top surfaces of the conductive structures 300, respectively. The second seed patterns 615 may be conformally formed in the upper openings 609 and on the top surface of the second insulating layer 601. The lower redistribution patterns 610PG and 610S may be formed in the upper openings 609 and on the top surface of the second insulating layer 601 to be provided on the second seed patterns 615. In an example embodiment, the lower redistribution patterns 610PG and 610S may be formed by an electroplating process using the second seed patterns 615 as a seed electrode.

Figure 9J:
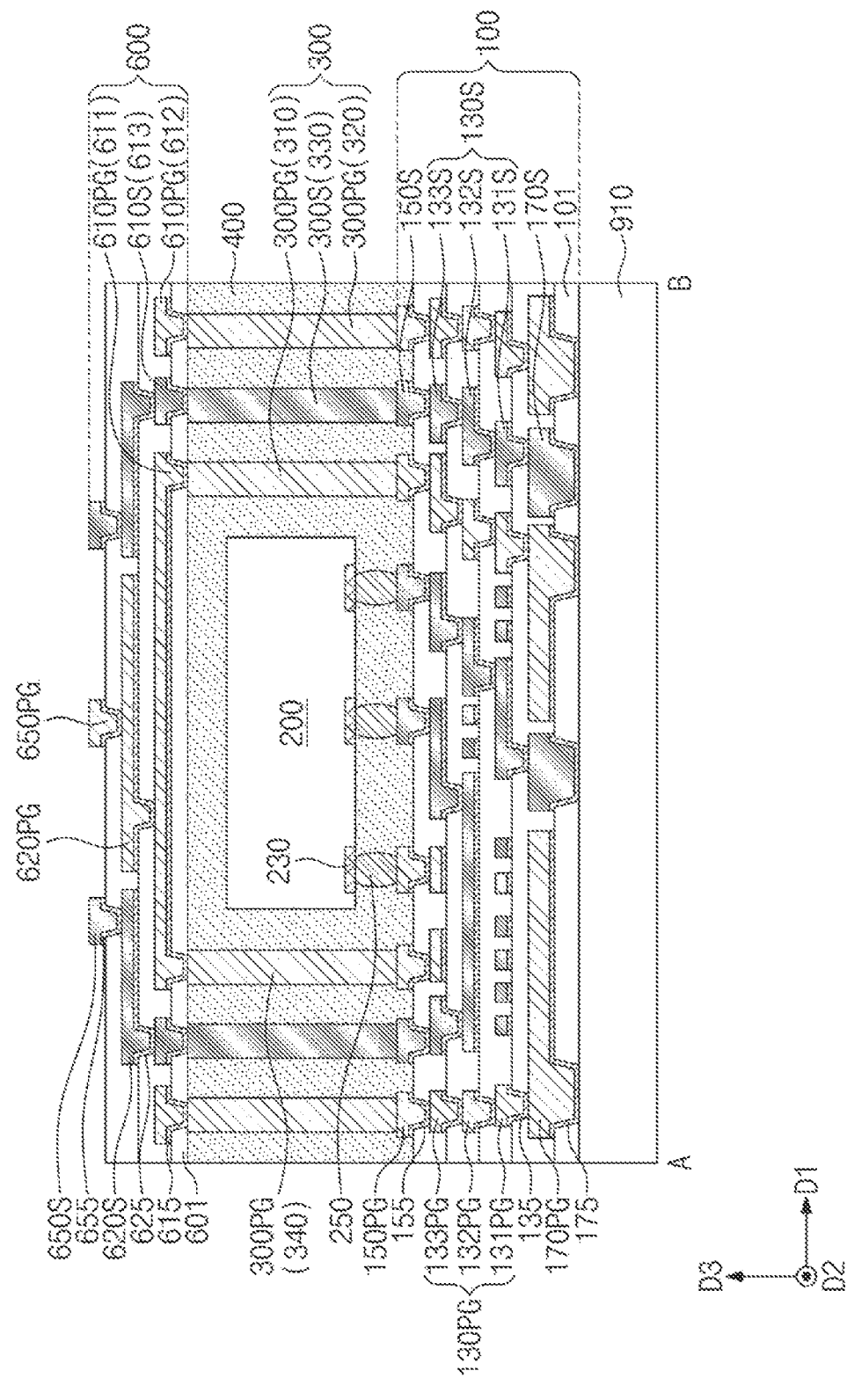

Referring to FIG. 9J, a plurality of the stacked second insulating layers 601 may be formed by repeating a process of forming the second insulating layer 601. The second seed patterns 615, the upper redistribution patterns 620PG and 620S, the upper seed pads 655, and the bonding pads 650PG and 650S may be formed on the lower ground/power redistribution patterns 610PG. In an example embodiment, the upper redistribution patterns 620PG and 620S may be formed by an electroplating process using the third seed patterns 625 as a seed electrode. In an example embodiment, the upper seed pads 655 and the bonding pads 650PG and 650S may be formed by the same or similar method as that for the seed pads 155 and the redistribution pads 150PG and 150S of FIG. 9E. Accordingly, the second redistribution substrate 600 may be fabricated. The second redistribution substrate 600 may include the second insulating layers 601, the second seed patterns 615, the lower redistribution patterns 610PG and 610S, the third seed patterns 625, the upper redistribution patterns 620PG and 620S, the upper seed pads 655, and the bonding pads 650PG and 650S.

Figure 9K:
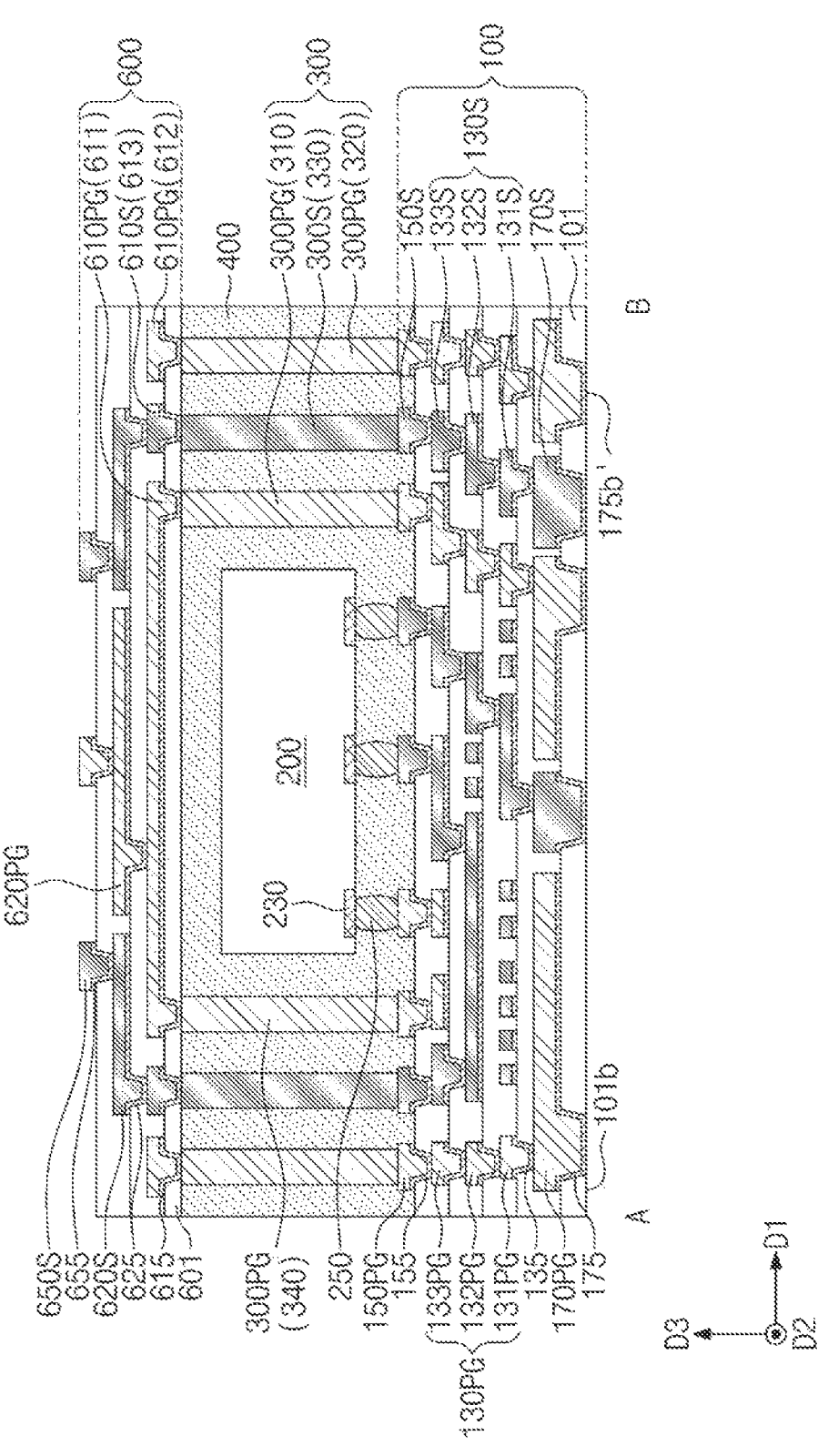

Referring to FIG. 9K, the carrier substrate 910 may be removed to expose a bottom surface of the first redistribution substrate 100. For example, the bottom surface 101b of the lowermost one of the first insulating layers 101 and bottom surfaces 175b' of the under-bump seed patterns 175 may be exposed.

Figure 9L:
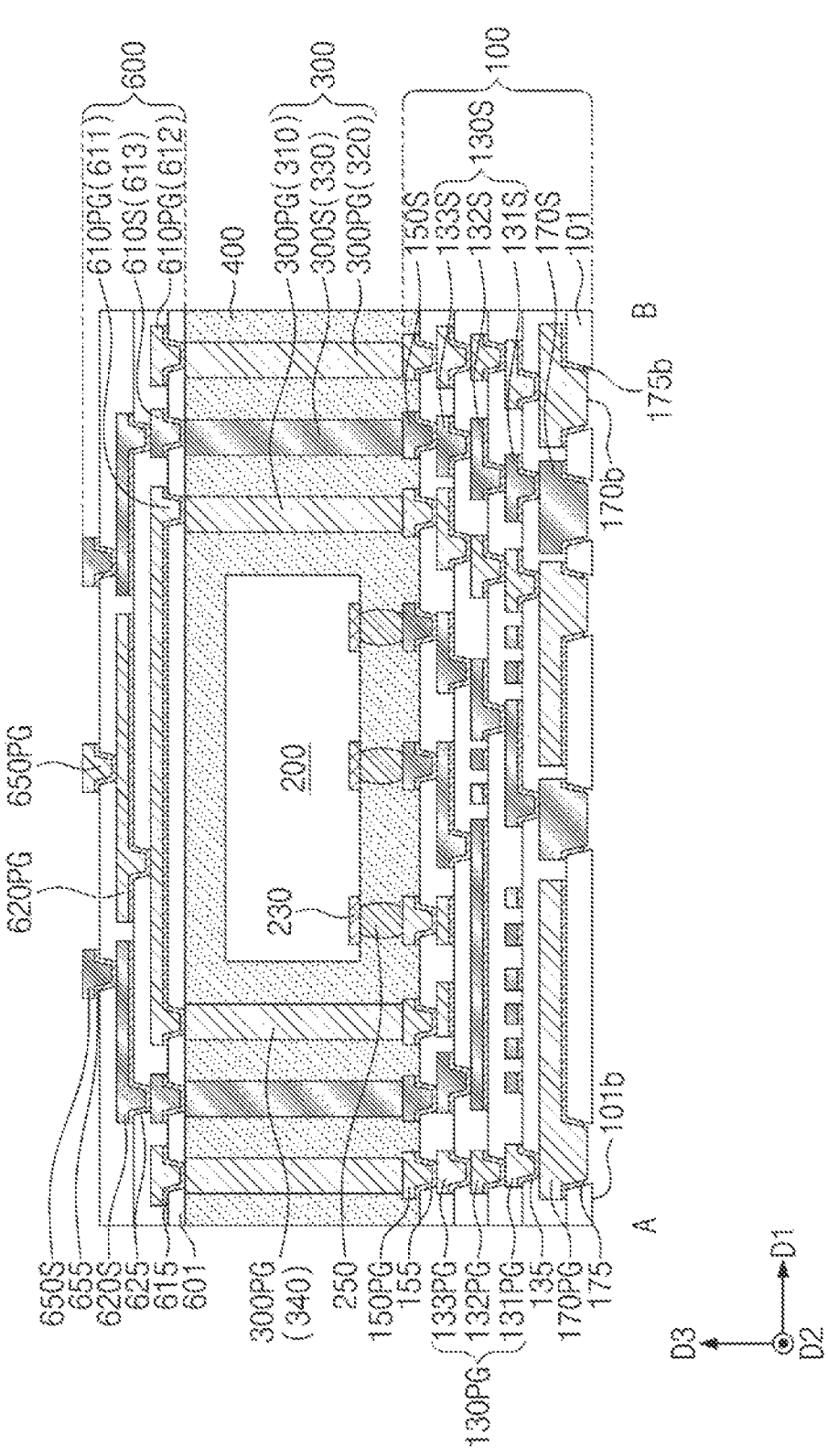

Referring to FIG. 9L, first portions of the exposed under-bump seed patterns 175 may be removed to expose the bottom surfaces 170b of the under-bump patterns 170PG and 170S. In an example embodiment, the under-bump seed patterns 175 may be removed by an etching process. The first portions of the under-bump seed patterns 175 may be portions on the bottom surfaces 170b of the under-bump patterns 170PG and 170S. In the etching process, the under-bump patterns 170PG and 170S and the lowermost one of the first insulating layers 101 may have an etch selectivity with respect to the under-bump seed patterns 175.

Because the under-bump seed patterns 175 are removed, the bottom surfaces 170b of the under-bump patterns 170PG and 170S may be disposed at a level that is higher than the bottom surface 101b of the lowermost one of the first insulating layers 101. A difference in level between the bottom surfaces 170b of the under-bump patterns 170PG and 170S and the bottom surface 101b of the lowermost one of the first insulating layers 101 may be substantially equal to the first thickness T of each of the under-bump seed patterns 175 (e.g., FIG. 1C).

After the etching process, each of the under-bump seed patterns 175 may have an undercut structure. The undercut structure of each of the under-bump seed patterns 175 may be formed between the side surface of the corresponding under-bump pattern 170PG or 170S and the first insulating layer 101. Accordingly, as shown in FIG. 1C, the bottommost surface 175b of the under-bump seed pattern 175 may be located at a level higher than the bottommost surface 170b of the corresponding under-bump pattern 170PG or 170S.

As another example, a process condition in the etching process may be controlled such that the bottommost surface 175b of the under-bump seed pattern 175 is located at substantially the same level as the bottom surface 170b of the under-bump pattern 170PG or 170S.

Referring back to FIG. 1D, the solder balls 500 may be respectively formed on the bottom surfaces 170b of the under-bump patterns 170PG and 170S and may be coupled to the under-bump patterns 170PG and 170S. The semiconductor package 10 may be fabricated through the afore-described process.

A method of fabricating a single semiconductor package 10 has been illustrated and described. However, methods of fabricating the semiconductor package 10 are not limited to such a chip-level fabrication method, and other fabrication methods may be used to fabricate semiconductor packages consistent with example embodiments. For example, the semiconductor package 1 may be fabricated in a chip, panel, or wafer level.

Figure 10A:
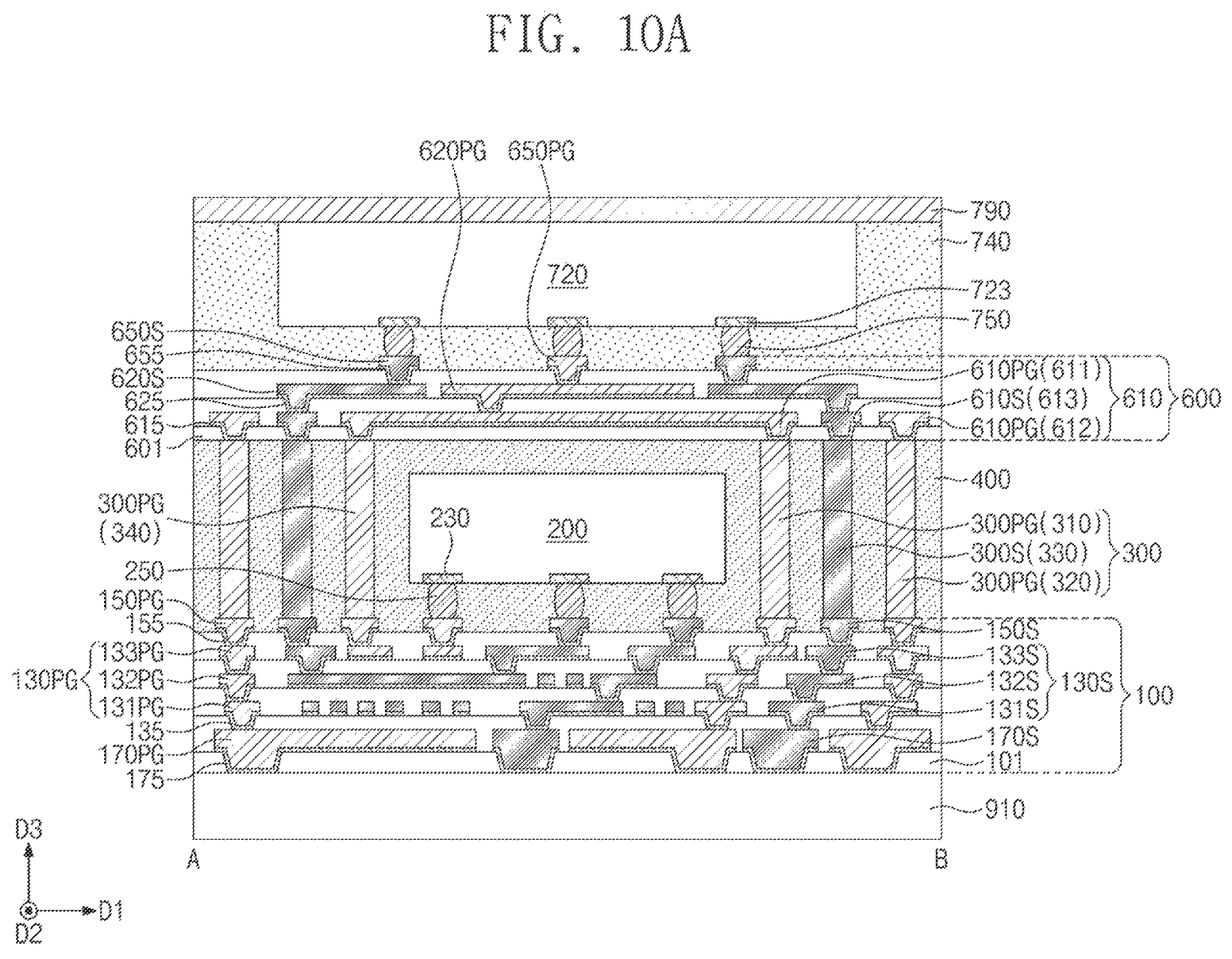
Figure 10B:
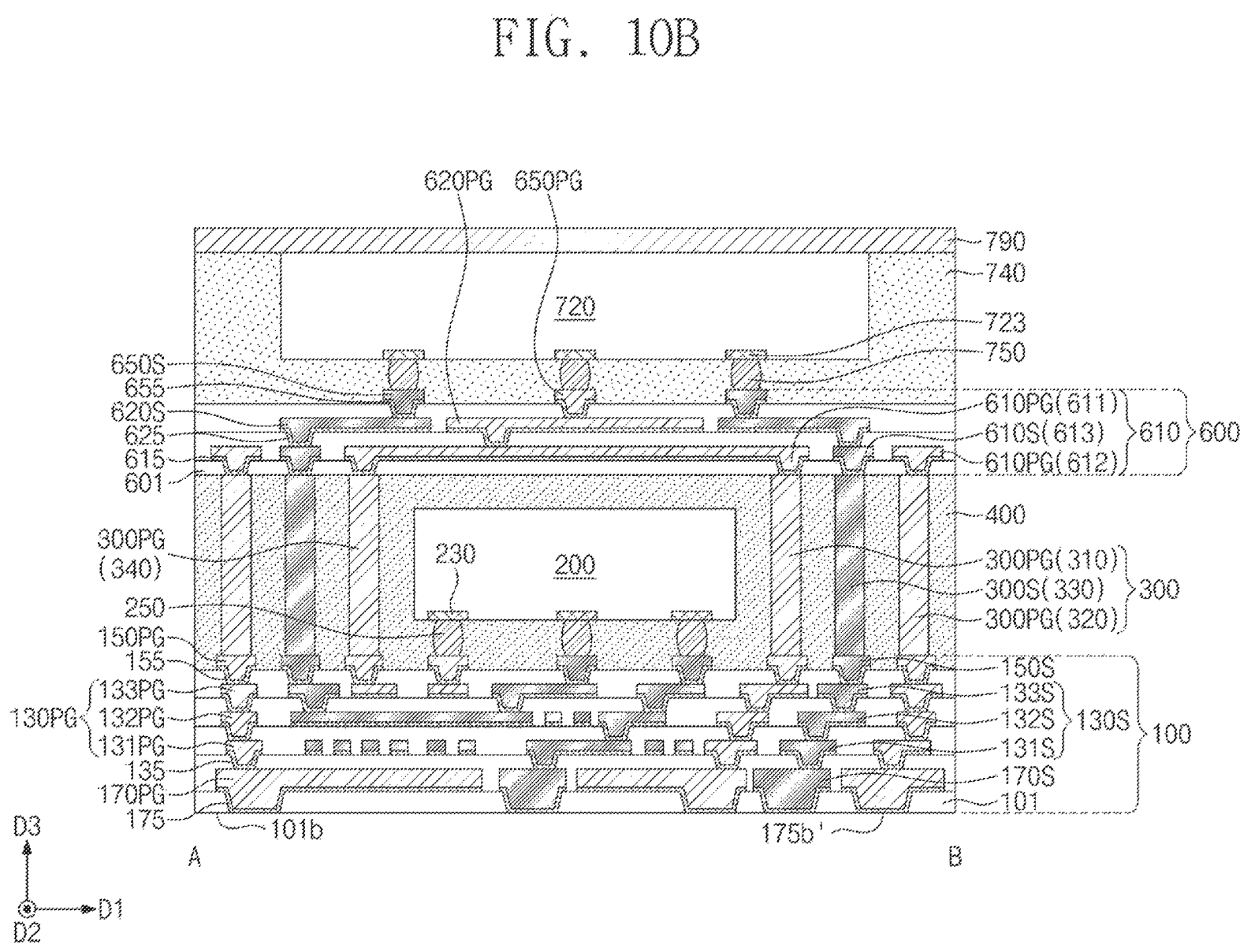
Figure 10C:
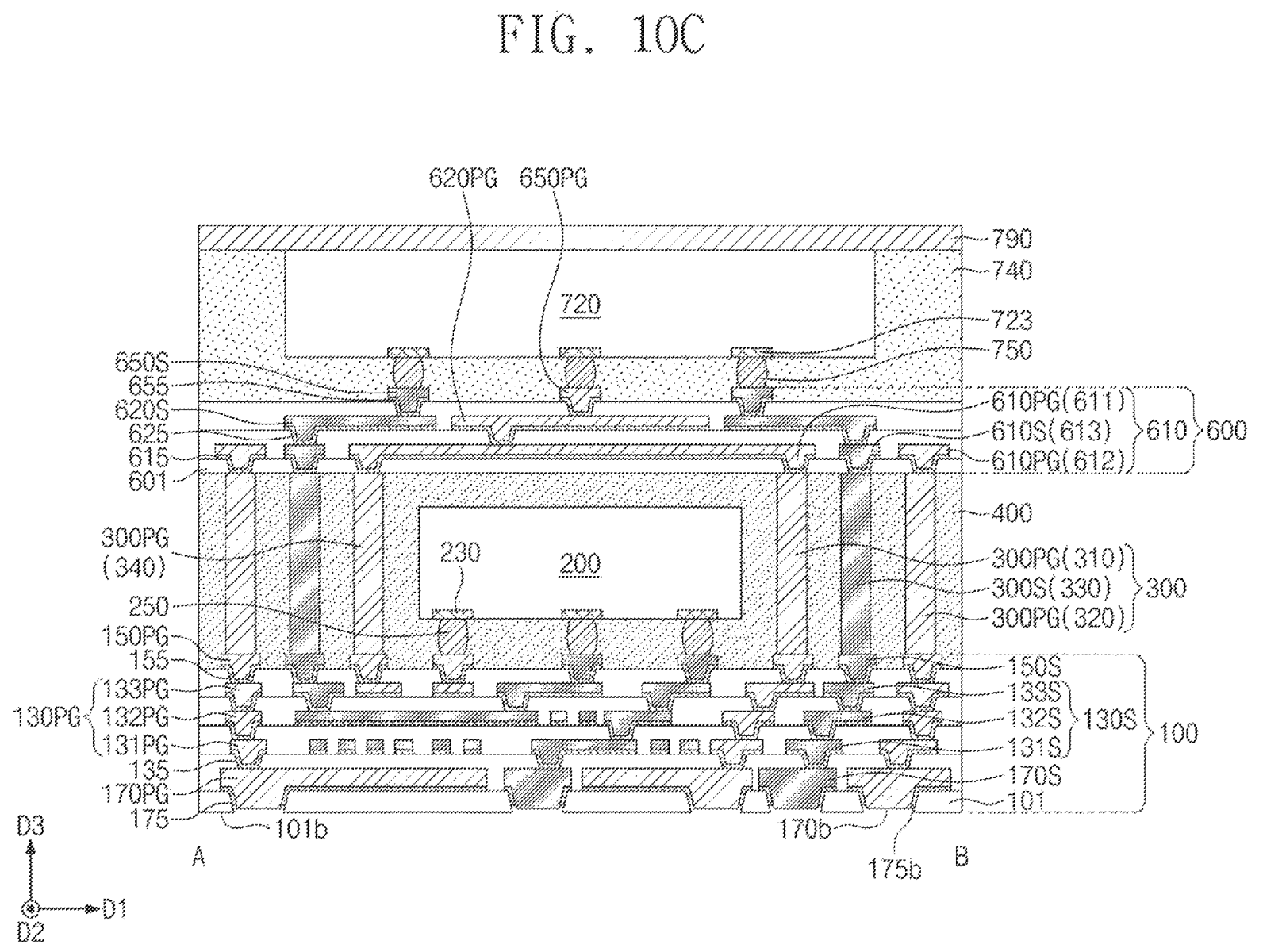

FIGS. 10A to 10C are sectional views illustrating a method of fabricating a semiconductor package according to an example embodiment. For concise description, a previously described element may be identified by the same reference number without repeating an overlapping description thereof Referring to FIG. 10A, the first redistribution substrate 100, the semiconductor chip 200, the conductive structures 300, the mold layer 400, and the second redistribution substrate 600 may be formed on the carrier substrate 910. The first redistribution substrate 100, the semiconductor chip 200, the conductive structures 300, the mold layer 400, and the second redistribution substrate 600 may be formed by substantially the same method as those in the example embodiment of FIGS. 9A to 9J.

Thereafter, the upper semiconductor chip 720 may be mounted on the second redistribution substrate 600. The mounting of the upper semiconductor chip 720 may include forming the upper bumps 750. The mold layer 400 may be formed on the second redistribution substrate 600 to be provide don the upper semiconductor chip 720. The heat dissipation structure 790 may be further formed on the upper mold layer 740.

Referring to FIG. 10B, the carrier substrate 910 may be removed to expose the bottom surface 101b of the lowermost one of the first insulating layers 101 and the bottom surfaces 175b' of the under-bump seed patterns 175.

Referring to FIG. 10C, the first portions of the exposed under-bump seed patterns 175 may be removed to expose the bottom surfaces 170b of the under-bump patterns 170PG and 170S. In an example embodiment, the removal of the under-bump seed patterns 175 may be performed by substantially the same method as that described with reference to FIG. 9L. The bottommost surfaces 175b of the under-bump seed patterns 175 may be disposed at a level higher than the bottom surfaces 170b of the under-bump patterns 170PG and 170S.

Referring back to FIG. 5A, the solder balls 500 may be attached to the exposed bottom surfaces 170b of the under-bump patterns 170PG and 170S. Accordingly, the fabrication of the semiconductor package 1 may be finished.

In the case where the fabrication of the semiconductor package 1 is performed in a wafer level or in a panel level, a sawing process may be further performed before the attaching process of the solder balls 500. A wafer-level semiconductor package may be divided into chip-level semiconductor packages 1 by the sawing process.

According to an example embodiment, a conductive structure may include a signal structure, a first ground structure, and a second ground structure. The signal structure may be interposed between the first and second ground structures and may be adjacent to the first and second ground structures. Accordingly, it may be possible to prevent or reduce a coupling noise of the signal structure and to realize a semiconductor package with improve reliability and electric characteristics.

While example embodiments have been particularly shown and described, it will be understood by one of ordinary skill in the art that variations in form and detail may be made therein without departing from the spirit and scope of the attached claims.

What is claimed is:

1. A semiconductor package, comprising:
a first substrate comprising a first under-bump pattern, a second under-bump pattern, and a third under-bump pattern;
a semiconductor chip provided on the first substrate;
conductive structures provided on the first substrate, laterally spaced apart from the semiconductor chip, and laterally spaced apart from each other; and
a second substrate provided on the semiconductor chip and the conductive structures,
wherein the third under-bump pattern is electrically isolated from the first and second under-bump patterns,
wherein the conductive structures comprise:
a first conductive structure coupled to the first under-bump pattern;
a second conductive structure coupled to the second under-bump pattern; and
a third conductive structure coupled to the third under-bump pattern and provided
adjacent to the first and second conductive structures,
wherein the first conductive structure is a ground or a power structure,
wherein the second conductive structure is the ground or the power structure,
wherein the third conductive structure is a signal structure,
wherein the third conductive structure is provided between the first conductive structure and the second conductive structure,
wherein when viewed in a plan view, the first conductive structure, the third conductive structure and the second conductive structure are alternately disposed, and laterally spaced apart from the semiconductor chip in sequence,
wherein the first under-bump pattern is wider than the third under-bump pattern, wherein the second under-bump pattern is wider than the third under-bump pattern, wherein the second substrate comprises a first redistribution pattern electrically connected to the first conductive structure, and wherein the first redistribution pattern vertically overlaps the semiconductor chip.

2. The semiconductor package of claim 1, wherein an area of a top surface of the first under-bump pattern is larger than an area of a top surface of the third under-bump pattern, and wherein an area of a top surface of the second under-bump pattern is larger than the area of the top surface of the third under-bump pattern.

3. The semiconductor package of claim 1, wherein a top surface of the first under-bump pattern and a top surface of the second under-bump pattern are both wider than a top surface of the third under-bump pattern.

4. The semiconductor package of claim 1, wherein the first under-bump pattern and the second under-bump pattern are configured to provide a ground or a power voltage, and wherein the third under-bump pattern is configured to provide a signal.

5. The semiconductor package of claim 1, wherein the second substrate further comprises:

a first redistribution pattern electrically connected to the first conductive structure;

a second redistribution pattern electrically connected to the second conductive structure; and a third redistribution pattern electrically connected to the third conductive structure, and wherein an area of a top surface of the first redistribution pattern and an area of a top surface of the second redistribution pattern are both larger than an area of a top surface of the third redistribution pattern.

6. The semiconductor package of claim 5, wherein the conductive structures further comprise:

a fourth conductive structure electrically connected to the first redistribution pattern; and a fifth conductive structure electrically connected to the second redistribution pattern.

7. The semiconductor package of claim 1, wherein the conductive structures further comprise a fourth conductive structure, wherein the first substrate further comprises a first shared conductive pattern, and wherein the first shared conductive pattern is electrically connected to the first conductive structure and the fourth conductive structure.

8. The semiconductor package of claim 7, wherein the conductive structures further comprise a fifth conductive structure, wherein the first substrate comprises a second shared conductive pattern, and wherein the second shared conductive pattern is electrically connected to the second conductive structure and the fifth conductive structure.

9. The semiconductor package of claim 1, wherein the first substrate further comprises under-bump seed patterns provided on side surfaces of the first to third under-bump patterns, and wherein at least a portion of bottom surfaces of each of the first under-bump pattern, the second under-bump pattern and the third under-bump pattern is exposed through the under-bump seed patterns.

10. The semiconductor package of claim 1, wherein, among the conductive structures, the first conductive structure, the second conductive structure and the third conductive tive structure are sequentially arranged without other conductive structures interposed therebetween.

11. A semiconductor package, comprising:

a first substrate;

a semiconductor chip provided on the first substrate;

conductive structures provided on the first substrate and laterally spaced apart from the semiconductor chip; and a second substrate provided on the semiconductor chip and the conductive structures, wherein the conductive structures comprise a first conductive structure, a second conductive structure, and a third conductive structure, which are adjacent to each other, wherein the third conductive structure is provided between, and electrically isolated from, the first and second conductive structures, wherein the first conductive structure, the third conductive structure and the second conductive structure are spaced apart from the semiconductor chip in sequence, wherein the second substrate comprises:

a first redistribution pattern electrically connected to the first conductive structure, and vertically overlaps the semiconductor chip;

a second redistribution pattern electrically connected to the second conductive structure; and a third redistribution pattern electrically connected to the third conductive structure, wherein an area of a top surface of the first redistribution pattern is larger than an area of a top surface of the third redistribution pattern, wherein an area of a top surface of the second redistribution pattern is larger than the area of the top surface of the third redistribution pattern, wherein the first conductive structure and the second conductive structure are configured to provide a ground or a power voltage, and wherein at least one of the first conductive structure and the second conductive structure is configured to provide the power voltage.

12. The semiconductor package of claim 11, wherein the first redistribution pattern defines a hole which penetrates therethrough.

13. The semiconductor package of claim 11, wherein the conductive structures further comprise a fourth conductive structure electrically connected to the first redistribution pattern, and a fifth conductive structure electrically connected to the second redistribution pattern.

14. The semiconductor package of claim 11, wherein the third conductive structure is configured to provide a signal.

15. The semiconductor package of claim 11, further comprising:

an upper semiconductor chip provided on the second substrate; and an upper mold layer provided directly on the second substrate to cover the upper semiconductor chip.

16. A semiconductor package, comprising:

a first substrate comprising a first insulating layer, under-bump patterns, under-bump seed patterns, a first ground/power conductive pattern, a second ground/power conductive pattern, and a signal conductive pattern;

a semiconductor chip provided on a top surface of the first substrate;

conductive structures provided on the top surface of the first substrate, and laterally spaced apart from both the semiconductor chip and from each other;

a mold layer provided on the top surface of the first substrate, side surfaces of the semiconductor chip and side surfaces of the conductive structures; and a second substrate provided on the mold layer and the conductive structures, and electrically connected to the conductive structures, wherein the conductive structures comprise:

a first conductive structure coupled to the first ground/power conductive pattern;

a second conductive structure coupled to the second ground/power conductive pattern;

a third conductive structure coupled to the signal conductive pattern; and a fourth conductive structure coupled to the first ground/power conductive pattern, wherein the third conductive structure is provided between the first and second conductive structures, and wherein the under-bump seed patterns are provided on side surfaces of the under-bump patterns, and have lower surfaces that are spaced apart from bottom surfaces of the under-bump patterns and are between an upper surface of the first insulating layer and a lower surface of the first insulating layer.

17. The semiconductor package of claim 16, wherein the under-bump patterns comprise:

a first under-bump pattern electrically connected to the first ground/power conductive pattern;

a second under-bump pattern electrically connected to the second ground/power conductive pattern; and a third under-bump pattern electrically connected to the signal conductive pattern, and wherein a top surface of the first under-bump pattern and a top surface of the second under-bump pattern are wider than a top surface of the third under-bump pattern.

18. The semiconductor package of claim 16, wherein the second substrate comprises:

a first redistribution pattern electrically connected to the first conductive structure;

a second redistribution pattern electrically connected to the second conductive structure; and a third redistribution pattern electrically connected to the third conductive structure, wherein an area of a top surface of the first redistribution pattern is larger than an area of a top surface of the third redistribution pattern, and wherein an area of a top surface of the second redistribution pattern is larger than the area of the top surface of the third redistribution pattern.

19. The semiconductor package of claim 16, wherein thicknesses of each of the under-bump patterns range from 5 μm to 20 μm.

20. The semiconductor package of claim 1, wherein the ground or the power structure and the signal structure are alternately disposed along each of a first horizontal direction and a second horizontal direction, and wherein the first horizontal direction and the second horizontal direction cross each other and are parallel to a bottom surface of the first substrate.

* * * * *